US009361985B2

(12) United States Patent
Kim et al.

(10) Patent No.: US 9,361,985 B2
(45) Date of Patent: Jun. 7, 2016

(54) NONVOLATILE MEMORY DEVICES INCLUDING SIMULTANEOUS IMPEDANCE CALIBRATION AND INPUT COMMAND

(71) Applicant: Samsung Electronics Co., Ltd., Suwon-si, Gyeonggi-do (KR)

(72) Inventors: Dong Kim, Hwasung-si (KR); Soonbok Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 66 days.

(21) Appl. No.: 14/144,659

(22) Filed: Dec. 31, 2013

(65) Prior Publication Data

US 2014/0185384 A1    Jul. 3, 2014

(30) Foreign Application Priority Data

Jan. 2, 2013  (KR) .................. 10-2013-0000288

(51) Int. Cl.
| | | |
|---|---|---|
| *G11C 11/34* | (2006.01) | |
| *G11C 16/06* | (2006.01) | |
| *G11C 7/04* | (2006.01) | |
| *G11C 16/10* | (2006.01) | |
| *G11C 16/20* | (2006.01) | |
| *G11C 29/02* | (2006.01) | |
| *G11C 29/50* | (2006.01) | |
| G11C 29/04 | (2006.01) | |

(52) U.S. Cl.
CPC  *G11C 16/06* (2013.01); *G11C 7/04* (2013.01); *G11C 16/10* (2013.01); *G11C 16/20* (2013.01); *G11C 29/028* (2013.01); *G11C 29/50008* (2013.01); *G11C 2029/0409* (2013.01); *G11C 2207/2254* (2013.01)

(58) Field of Classification Search
USPC ............. 365/185.02, 185.09, 185.11, 185.17, 365/185.18, 185.24, 185.29, 185.33; 324/750.3; 326/30
See application file for complete search history.

(56) References Cited

U.S. PATENT DOCUMENTS

| | | | |
|---|---|---|---|
| 6,965,529 B2 | 11/2005 | Zumkehr et al. | |
| 7,126,853 B2 | 10/2006 | Kim | |
| 7,319,621 B2* | 1/2008 | Ba ........................... | 365/185.02 |
| 7,728,619 B1* | 6/2010 | Tzou et al. .............. | 365/185.11 |
| 7,773,440 B2 | 8/2010 | Kim et al. | |
| 7,821,292 B2* | 10/2010 | Yang ....................... | G11C 7/04 326/30 |
| 8,064,250 B2 | 11/2011 | Abdulla | |
| 8,085,611 B2 | 12/2011 | Lin et al. | |
| 8,307,270 B2 | 11/2012 | Kim et al. | |
| 8,391,088 B2 | 3/2013 | Sohn et al. | |
| 8,713,404 B2* | 4/2014 | Fai et al. .................. | 365/185.09 |
| 8,742,780 B2* | 6/2014 | Kim ................ | G01R 31/31717 324/750.3 |
| 8,988,940 B2* | 3/2015 | Tannhof ............ | G11C 16/0441 365/185.18 |
| 2011/0026334 A1 | 2/2011 | Bae et al. | |
| 2011/0050303 A1 | 3/2011 | Ma | |
| 2011/0109344 A1 | 5/2011 | Choi et al. | |
| 2011/0141829 A1 | 6/2011 | Ware | |

FOREIGN PATENT DOCUMENTS

| | | |
|---|---|---|
| JP | 2000-307568 A | 11/2000 |
| JP | 2011-103638 A | 5/2011 |
| KR | 10-2011-0012805 A | 2/2011 |

* cited by examiner

*Primary Examiner* — Trong Phan
(74) *Attorney, Agent, or Firm* — Myers Bigel & Sibley, P.A.

(57) ABSTRACT

An operating method of a nonvolatile memory device is provided which includes receiving a command sequence; detecting whether the input command sequence accompanies an impedance calibration operation; and if the input command sequence accompanies the impedance calibration operation, simultaneously performing an operation corresponding to the input command sequence and the impedance calibration operation.

13 Claims, 19 Drawing Sheets

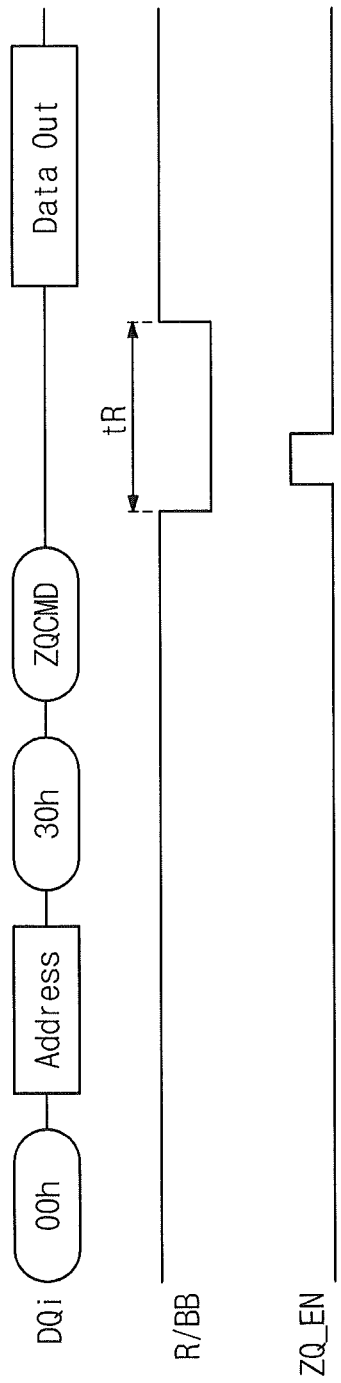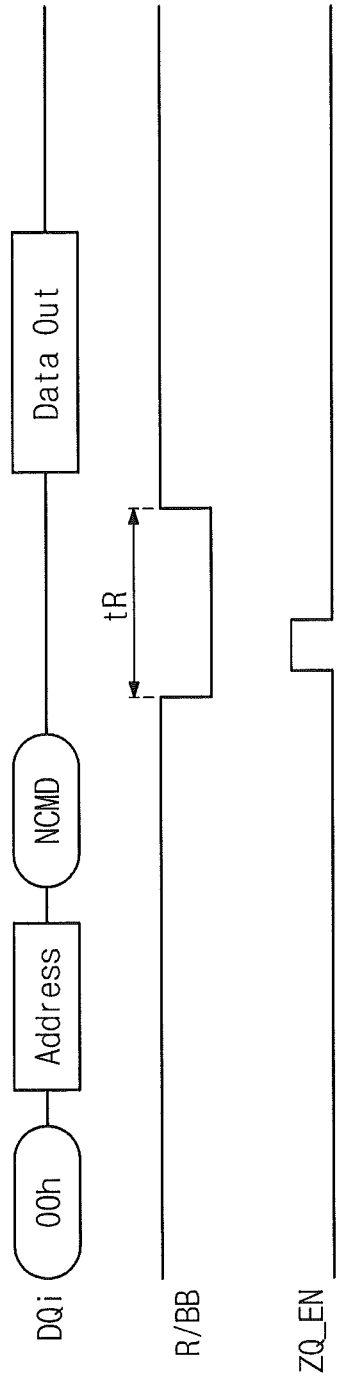

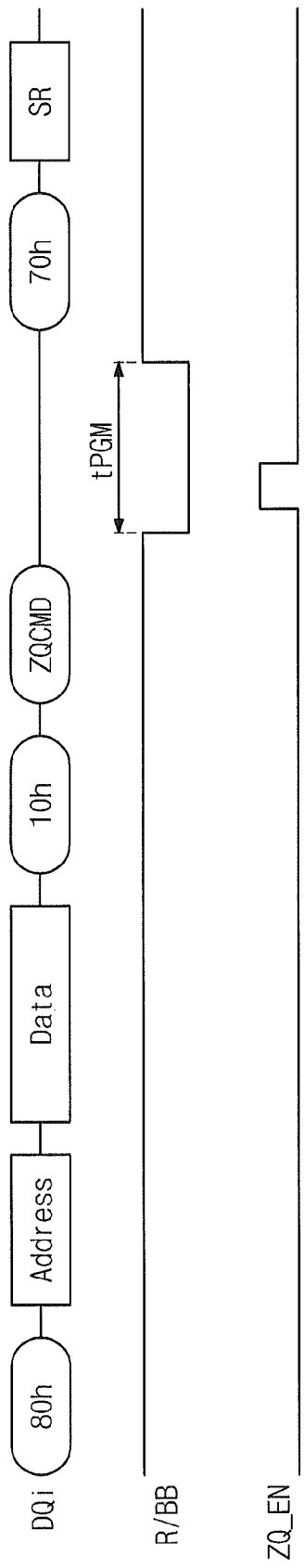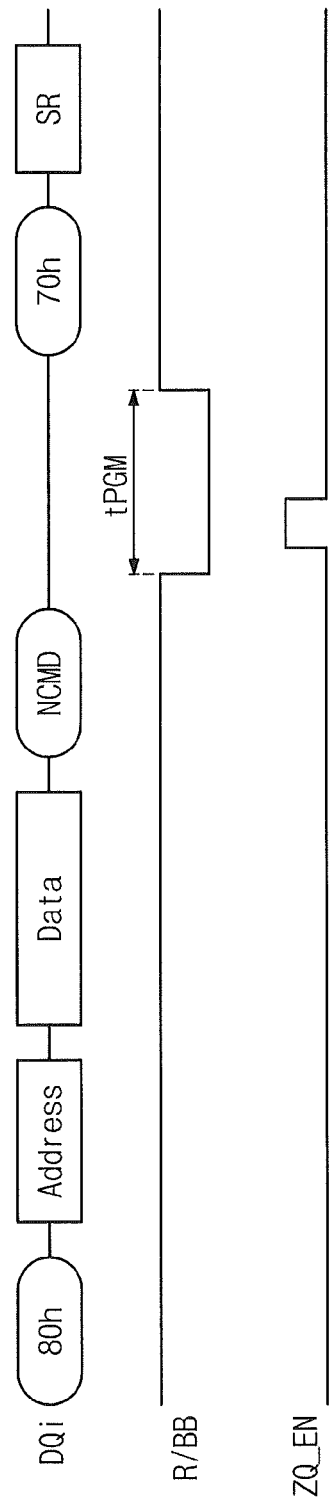

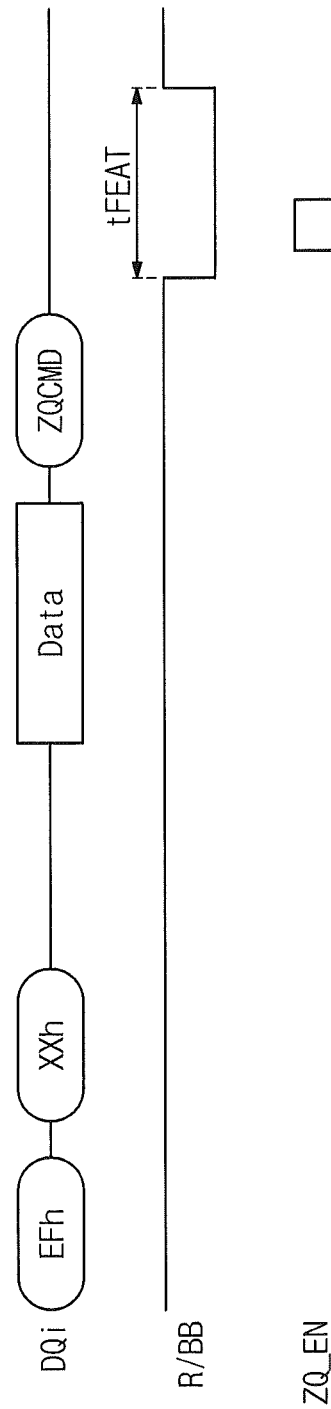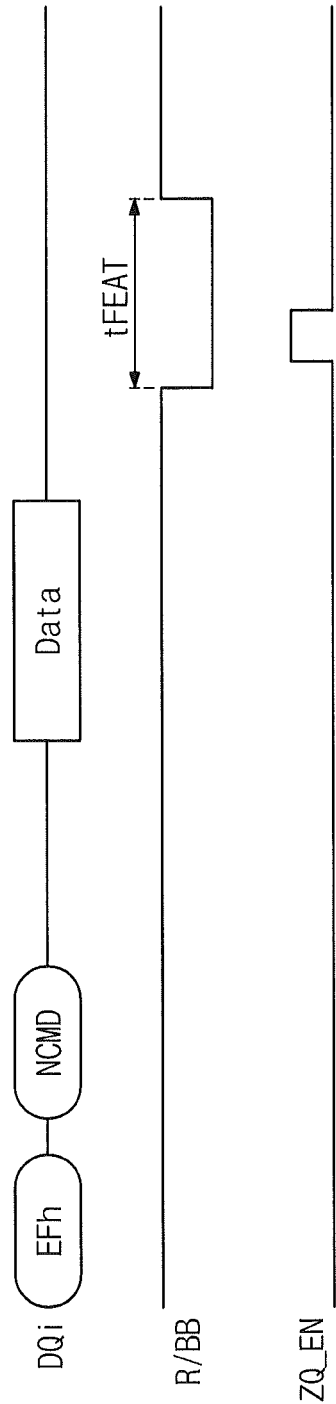

NONVOLATILE MEMORY DEVICES INCLUDING SIMULTANEOUS IMPEDANCE CALIBRATION AND INPUT COMMAND

CROSS-REFERENCE TO RELATED APPLICATION

This U.S. non-provisional application claims priority under 35 U.S.C. §119 to Korean Patent Application No. 10-2013-0000288 filed Jan. 2, 2013, the entirety of which is hereby incorporated by reference herein.

BACKGROUND

The inventive concepts described herein relate to semiconductor memory devices, and more particularly, relate to impedance calibration of memory devices.

Semiconductor memories are widely used components of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, the data are stored and can be read out as long as the power is applied, and are lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of being electrically erased or written. Application of the EEPROM is widened to an auxiliary memory or to system programming where continuous updates are needed (flash EEPROM).

Many memory devices use impedance calibration (often referred to as "ZQ calibration") to improve the performance thereof. Impedance calibration may be used to calibrate the input/output circuits of the memory device to account for variations in the system environment of temperature, voltage, component drift, etc.

SUMMARY

One aspect of embodiments of the inventive concepts is directed to provide an operating method of a nonvolatile memory device comprising receiving a command sequence; detecting whether the input command sequence accompanies an impedance calibration operation; and if the input command sequence accompanies the impedance calibration operation, simultaneously performing an operation corresponding to the input command sequence and the impedance calibration operation.

In example embodiments, the operating method further comprises performing an operation corresponding to the input command sequence without the impedance calibration operation when the input command sequence does not accompany the impedance calibration operation.

In example embodiments, a time taken to perform the impedance calibration operation is shorter than a time taken to perform an operation corresponding to the input command sequence.

In example embodiments, an operation corresponding to the input command sequence is one selected from a group of a read operation, a program operation, a set feature operation, and an erase operation.

Another aspect of embodiments of the inventive concepts is directed to provide a nonvolatile memory device comprising a memory cell array; control logic configured to detect whether an input command sequence accompanies an impedance calibration operation; an impedance calibration circuit connected with an external reference resistor and configured to generate an impedance calibration code in response to the detection result of the control logic; and an output driver having an output impedance value calibrated by the impedance calibration code.

In example embodiments, the control logic activates a control signal as the detection result when the input command sequence accompanies the impedance calibration operation and the impedance calibration circuit generates the impedance calibration code in response to an activation of the control signal.

In example embodiments, the control logic inactivates (i.e., deactivates) the control signal as the detection result when the input command sequence does not accompany the impedance calibration operation and the impedance calibration circuit is inactivated by an inactivation of the control signal.

In example embodiments, when the input command sequence does not accompany the impedance calibration operation, the control logic controls an operation corresponding to the input command sequence without the impedance calibration operation.

In example embodiments, a time taken to perform the impedance calibration operation is shorter than a time taken to perform an operation corresponding to the input command sequence.

In example embodiments, an operation corresponding to the input command sequence is one selected from a group of a read operation, a program operation, a set feature operation, and an erase operation.

In example embodiments, the memory cell array comprises a plurality of NAND strings.

Still another aspect of embodiments of the inventive concepts is directed to provide a memory system comprising a reference resistor; a NAND flash memory device connected with the reference resistor and configured to provide an impedance calibration operation; and a memory controller configured to provide the NAND flash memory device with one of first and second command sequences according to whether an impedance calibration condition of the NAND flash memory device satisfies a reference. The first command sequence is a command sequence accompanying the impedance calibration operation and the second command sequence is a default command sequence not accompanying the impedance calibration operation. The NAND flash memory device performs the impedance calibration operation during a busy period where an operation corresponding to the first command sequence is performed.

In example embodiments, the impedance calibration condition is at least one of a temperature, a voltage, and a host request frequency or a combination thereof.

In example embodiments, an operation corresponding to the first command sequence is one selected from a group of a read operation, a program operation, a set feature operation, and an erase operation.

In example embodiments, the first command sequence is implemented by adding a command indicating an impedance calibration operation to the second command sequence or by changing one of commands in the second command sequence into a command indicating an impedance calibration operation.

Yet another aspect of embodiments of the inventive concepts provide an operating method of a memory device comprising simultaneously performing an impedance calibration operation of the memory device and a read operation, a program operation, a set feature operation or an erase operation of the memory device.

In example embodiments, the simultaneously performing is responsive to receiving a read command, a program command, a set feature command or an erase command that is to be performed by the memory device when the impedance calibration operation is also to be performed.

In example embodiments, the simultaneously performing is performed so that the impedance calibration operation does not interfere with the read operation, the program operation, the set feature operation or the erase operation.

In example embodiments, the simultaneously performing comprises adding an impedance calibration command to a command sequence for the read operation, the program operation, the set feature operation or the erase operation.

In example embodiments, the impedance calibration operation of the memory device is performed by the memory device at a time during the read operation, the program operation, the set feature operation or the erase operation that an input/output transition of the memory device is not taking place.

BRIEF DESCRIPTION OF THE DRAWINGS

The above and other objects and features will become apparent from the following description with reference to the following figures, wherein like reference numerals refer to like parts throughout the various figures unless otherwise specified, and wherein

FIGS. 6A and 6B are diagrams a read command sequence according to an embodiment of the inventive concepts;

FIGS. 7A and 7B are diagrams a program command sequence according to an embodiment of the inventive concepts;

FIGS. 9A and 9B are diagrams a set feature command sequence according to an embodiment of the inventive concepts;

DETAILED DESCRIPTION

Figure 1:
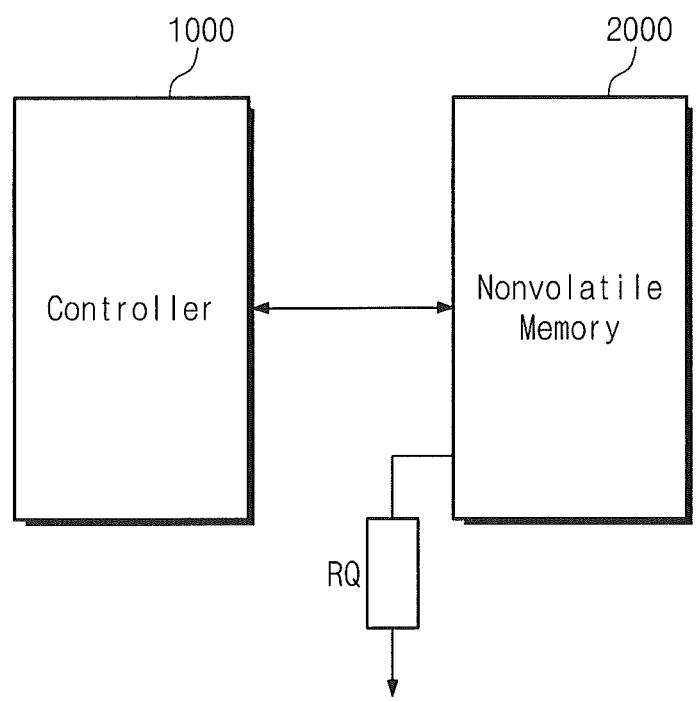
FIG. 1 is a block diagram schematically illustrating a memory system according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment of the inventive concepts.

Referring to FIG. 1, a memory system according to an embodiment of the inventive concepts may include a memory controller 1000 and a nonvolatile memory device 2000. The memory controller 1000 may be configured to control the nonvolatile memory device 2000 according to an external request (e.g., a write request, a read request, etc.). The memory controller 1000 may be configured to control the nonvolatile memory device 2000 according to an internal request (e.g., an operation associated with sudden power-off, a wear-leveling operation, a read reclaim operation, etc.) without an external request. An operation corresponding to an internal request of the memory controller 1000 may be executed within a timeout period of a host after a host request is processed. Alternatively, an operation corresponding to an internal request of the memory controller 1000 may be executed within an idle time of the memory controller 1000. The nonvolatile memory device 2000 may operate responsive to the control of the memory controller 1000, and may be used as a type of storage medium which stores data information. The storage medium may be formed of one or more memory chips. The nonvolatile memory device 2000 may communicate with the memory controller 1000 via one or more channels. The nonvolatile memory device 2000 may include a NAND flash memory device, for example.

As illustrated in FIG. 1, a reference resistor RQ may be connected with the nonvolatile memory device 2000. The reference resistor RQ may be used for an impedance calibration operation of the nonvolatile memory device 2000. The impedance calibration operation of the nonvolatile memory device 2000 may be performed under a control of the memory controller 1000. For example, the impedance calibration operation of the nonvolatile memory device 2000 may be performed based on impedance calibration information provided from the memory controller 1000. The impedance calibration information, for example, may be provided to the nonvolatile memory device 2000 when an impedance calibration condition satisfied a reference. Here, at least one a temperature, a voltage, and a host request frequency or a combination thereof may be used as the impedance calibration condition. The impedance calibration information may include a command sequence, and the impedance calibration operation of the nonvolatile memory device 2000 may be performed during a time when an operation corresponding to the host request is executed. In other words, the impedance calibration operation of the nonvolatile memory device 2000 and the operation corresponding to the host request may be simultaneously performed in the nonvolatile memory device 2000. This may mean that the impedance calibration operation of the nonvolatile memory device 2000 is performed during a busy period (or, a period where an input/output transition does not exist) of the nonvolatile memory device 2000. Thus, although the impedance calibration operation is performed, lowering of the performance of the nonvolatile memory device 2000 or the memory system may be reduced or prevented.

Figure 2:
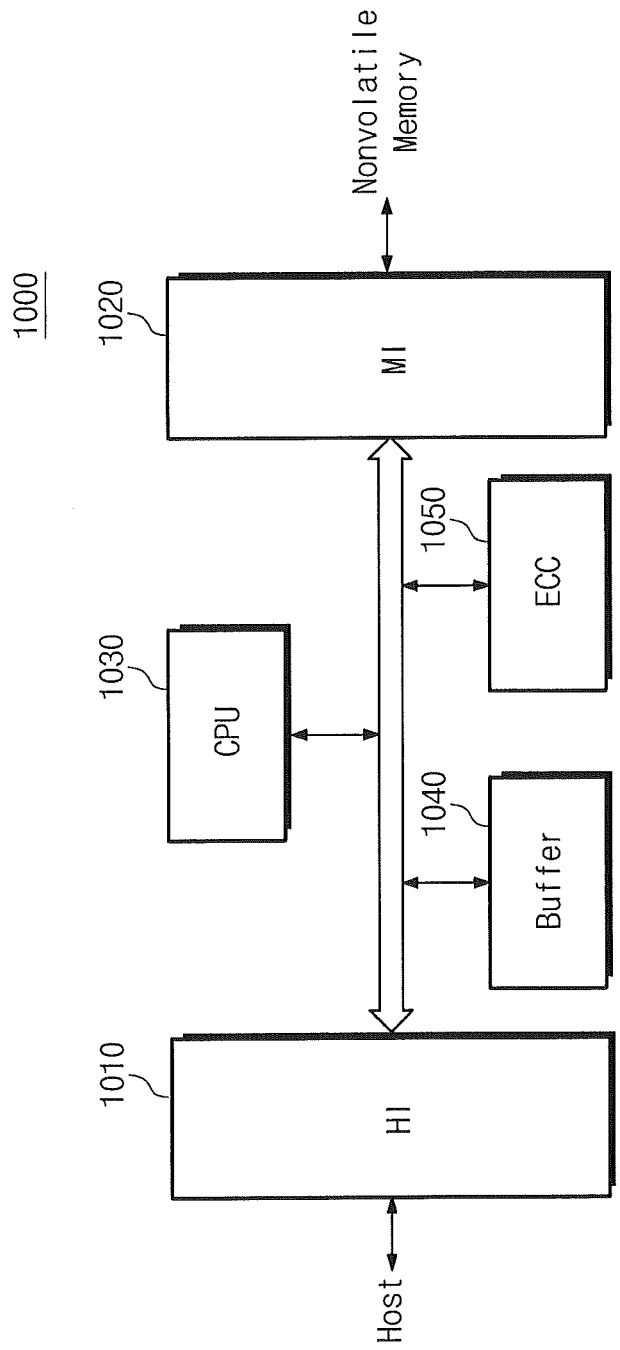
FIG. 2 is a block diagram schematically illustrating a memory controller in FIG. 1 according to an embodiment of the inventive concepts.

FIG. 2 is a block diagram schematically illustrating a memory controller in FIG. 1 according to an embodiment of the inventive concepts. Referring to FIG. 2, a memory controller 1000 may include a host interface (HI) 1010 as a first interface, a memory interface (MI) 1020 as a second interface, a CPU 1030, a buffer memory 1040, and an error detecting and correcting circuit (ECC) 1050.

The host interface 1010 may be configured to interface with an external device (for example, a host), and the memory interface 1020 may be configured to interface with a nonvolatile memory device 2000 illustrated in FIG. 1. The CPU 1030 may be configured to control an overall operation of the controller 1000. The CPU 1030 may be configured to operate firmware such as Flash Translation Layer (FTL), for example. The FTL may perform a variety of functions. For example, the FTL may include a variety of layers performing an address mapping operation, a read reclaim operation, an error correction operation, and so on.

The buffer memory 1040 may be used to temporarily store data transferred from an external device via the host interface 1010 or data to be transferred from the nonvolatile memory device 2000 via the memory interface 1020. The buffer memory 1040 may be used to store information (e.g., address mapping information, etc.) necessary to control the nonvolatile memory device 2000. The buffer memory 1040 may be formed of DRAM, SRAM, or a combination of DRAM and SRAM. However, the inventive concepts are not limited thereto. The ECC 1050 may be configured to encode data to be stored in the nonvolatile memory device 2000 and to decode data read out from the nonvolatile memory device 2000.

The CPU 1030 may determine whether a host request frequency reaches a reference. For example, the CPU 1030 may be configured to count a read request of a host. At a host request (e.g., a read or program operation), the CPU 1030 may select one of first and second command sequences, based on whether a host request frequency reaches a reference. A set of commands may be provided to the nonvolatile memory device 2000 according to the selected command sequence. For example, the first command sequence may be a command sequence accompanying an impedance calibration operation, and the second command sequence may be a command sequence not accompanying the impedance calibration operation. Here, a command sequence may be used to perform a read operation, a program operation, an erase operation, a set feature operation, and so on.

Although not illustrated in figures, the memory controller 1000 may further include a randomizer/de-randomizer which is configured to randomize data to be stored in the nonvolatile memory device 2000 and to de-randomize data read from the nonvolatile memory device 2000. An example of the randomizer/de-randomizer is disclosed in U.S. Patent Publication No. 2010/0088574, the entire contents of which are hereby incorporated by reference.

In example embodiments, the host interface 1010 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 3:
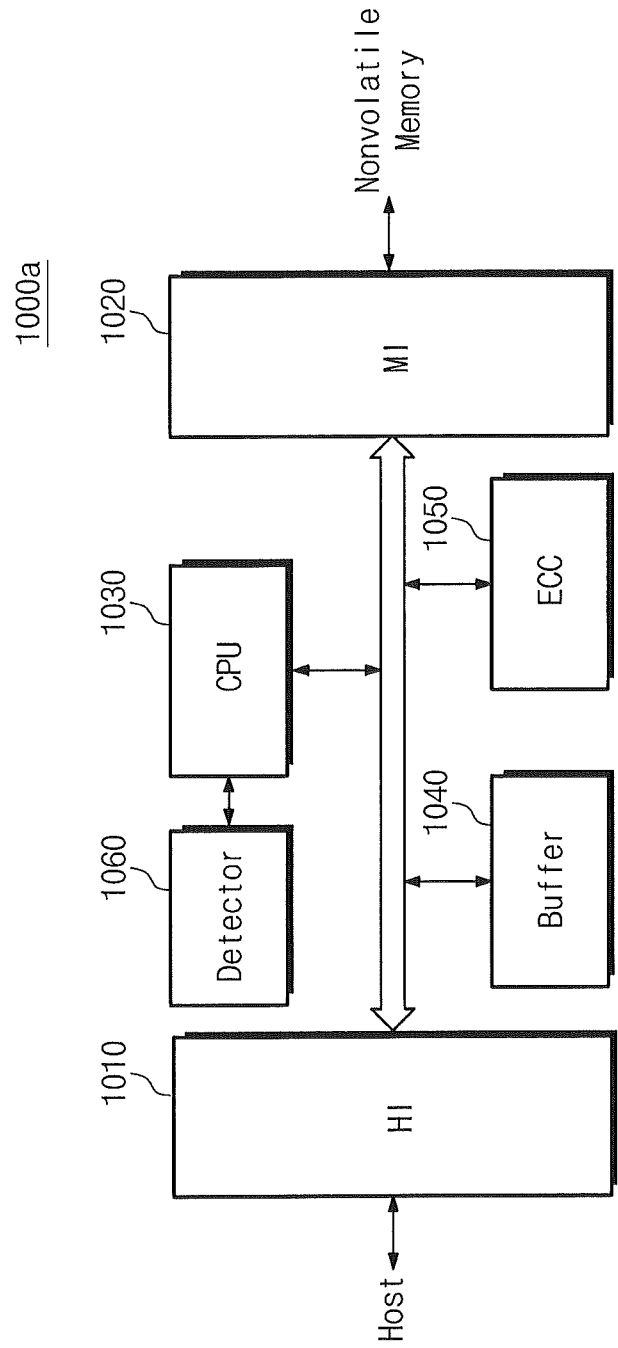
FIG. 3 is a block diagram schematically illustrating a memory controller in FIG. 1 according to another embodiment of the inventive concepts.

FIG. 3 is a block diagram schematically illustrating a memory controller in FIG. 1 according to another embodiment of the inventive concepts.

Referring to FIG. 3, a memory controller 1000a may include a host interface 1010 as a first interface, a memory interface 1020 as a second interface, a CPU 1030, a buffer memory 1040, an error detecting and correcting circuit (ECC) 1050, and a detector 1060. The memory controller 1000a may be substantially the same as a memory controller 1000 of FIG. 2 excepting for the following difference, and a description thereof is thus omitted.

The detector 1060 may be configured to detect at least one of a temperature and a voltage of a memory controller 1000. Temperature/voltage information detected by the detector 1060 may be provided to the CPU 1030. The CPU 1030 may determine whether the temperature/voltage information gets out of a particular range. At a host request (e.g., a read or program operation), the CPU 1030 may select one of first and second command sequences for a host request, based on whether the temperature/voltage information gets out of a particular range. A set of commands may be provided to the nonvolatile memory device 2000 according to the selected command sequence. For example, the first command sequence may be a command sequence accompanying an impedance calibration operation, and the second command sequence may be a command sequence not accompanying the impedance calibration operation. Here, a command sequence may be used to perform a read operation, a program operation, an erase operation, a set feature operation, and so on.

In other example embodiments, the impedance calibration operation may be decided based on a host request frequency described with reference to FIG. 2 and detection information described with reference to FIG. 3.

Figure 4:
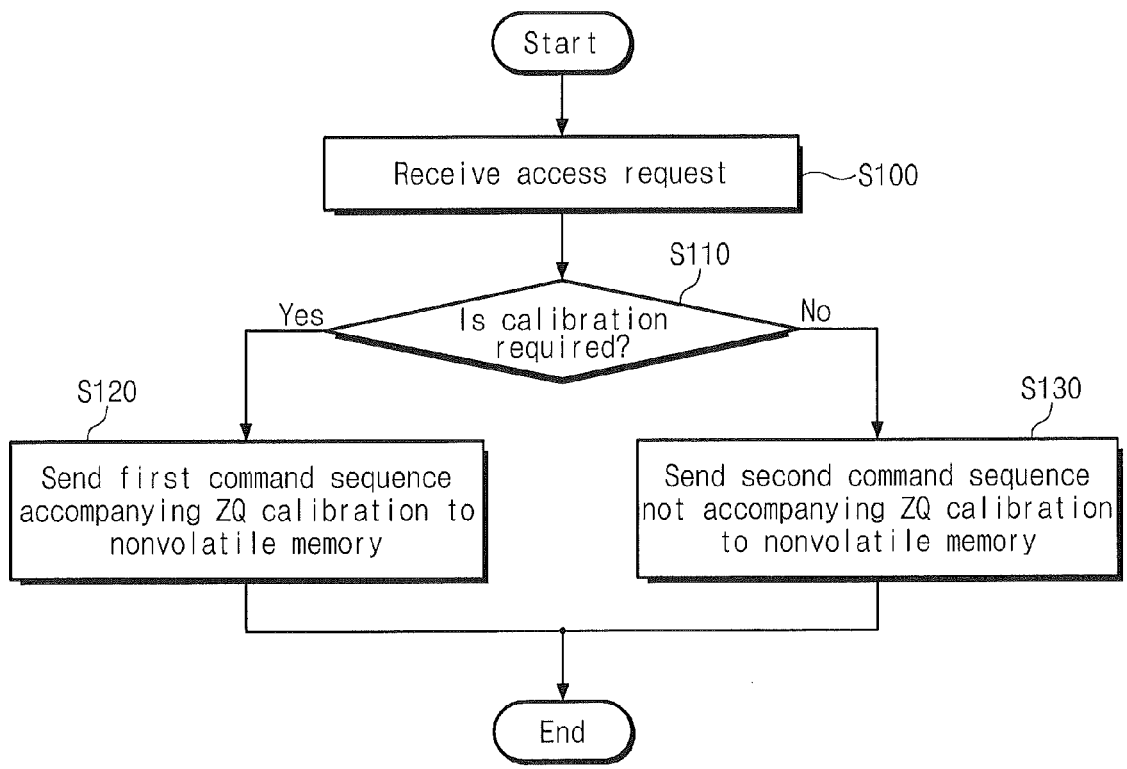
FIG. 4 is a flow chart schematically illustrating an operation of a memory controller according to an embodiment of the inventive concepts.

FIG. 4 is a flow chart schematically illustrating an operation of a memory controller according to an embodiment of the inventive concepts.

In operation S110, a memory controller 1000/1000a may receive an access request from a host. Here, the access request may include a read operation, a program operation, and so on. A CPU 1030 of the memory controller 1000/1000a may determine whether an impedance calibration operation on a nonvolatile memory device 2000 is required. For example, the CPU 1030 of the memory controller 1000/1000a may determine whether an impedance calibration operation on a nonvolatile memory device 2000 is required, based on a host request frequency. Alternatively, the CPU 1030 of the memory controller 1000/1000a may determine whether an impedance calibration operation on a nonvolatile memory device 2000 is required, based on temperature/voltage information. Still alternatively, the CPU 1030 of the memory controller 1000/1000a may determine whether an impedance calibration operation on a nonvolatile memory device 2000 is required, based on a host request frequency and temperature/voltage information.

If an impedance calibration operation on a nonvolatile memory device 2000 is required, the method may proceed to operation S120, in which the memory controller 1000/1000a may send a first command sequence accompanying the impedance calibration operation to the nonvolatile memory device 2000. In this case, the nonvolatile memory device 2000 may simultaneously perform the impedance calibration operation and an operation (e.g., a read operation, a program operation, etc.) corresponding to the command sequence. Afterwards, the method may be ended.

If an impedance calibration operation on a nonvolatile memory device 2000 is not required, the method may proceed to operation 5130, in which the memory controller 1000/1000a may send a second command sequence not accompanying the impedance calibration operation to the nonvolatile memory device 2000. In this case, the nonvolatile memory device 2000 may perform an operation (e.g., a read operation, a program operation, etc.) corresponding to the command sequence. That is, the impedance calibration operation may not be performed. Afterwards, the method may be ended.

Figure 5:
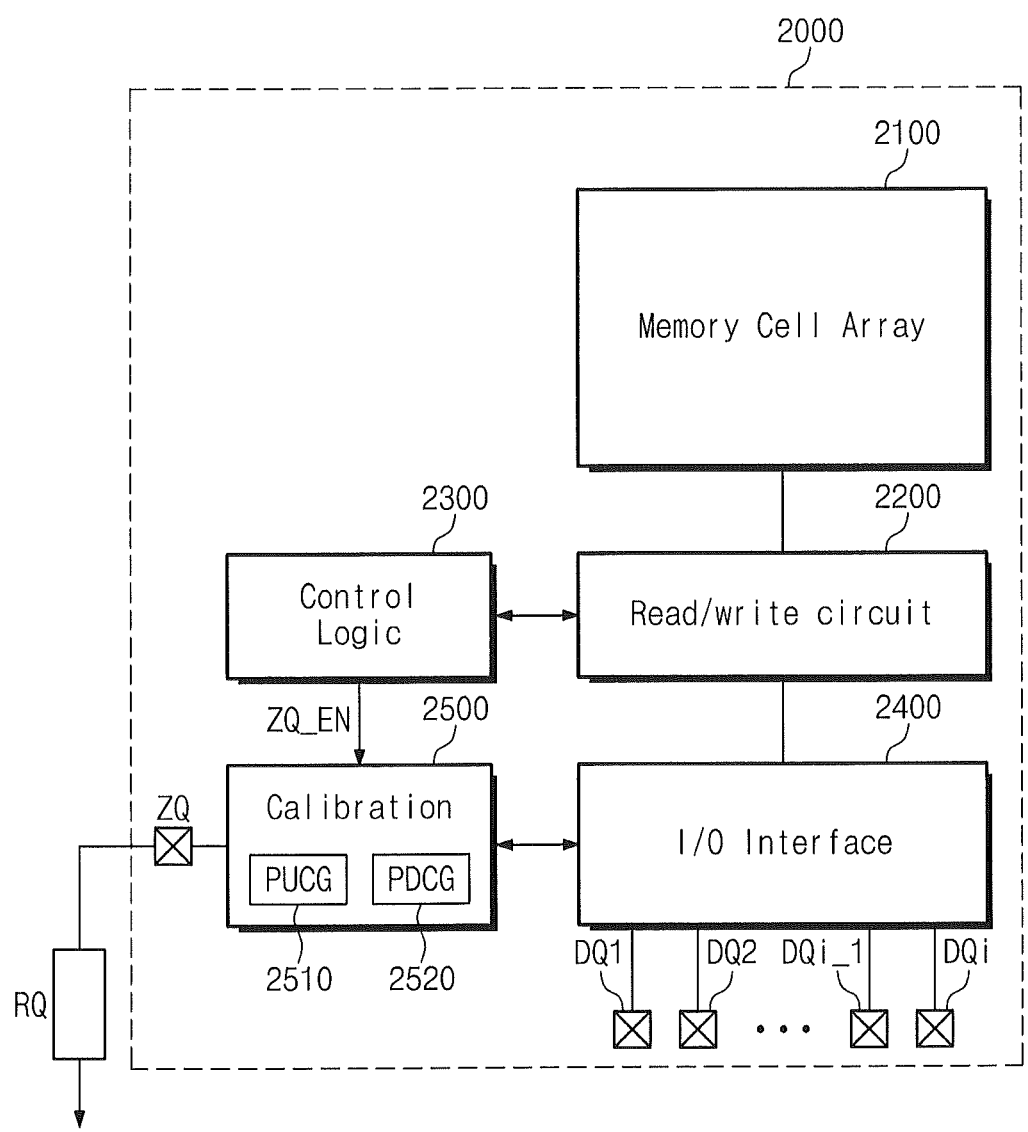
FIG. 5 is a block diagram schematically illustrating a nonvolatile memory device of FIG. 1 according to an embodiment of the inventive concepts.

FIG. 5 is a block diagram schematically illustrating a nonvolatile memory device of FIG. 1 according to an embodiment of the inventive concepts.

A nonvolatile memory device 2000 may be a NAND flash memory device, for example. However, it is well understood that the nonvolatile memory device 2000 is not limited to the NAND flash memory device. For example, the inventive concepts may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device 2000 can be implemented to have a three-dimensional array structure. A nonvolatile memory device with the three-dimensional array structure may be referred to as a vertical NAND flash memory device. The inventive concepts may be applied to a Charge Trap Flash (CTF) memory device including a charge storage layer formed of an insulation film as well as a flash memory device including a charge storage layer formed of a conductive floating gate.

Referring to FIG. 5, the nonvolatile memory device 2000 may include a memory cell array 2100, a read/write circuit 2200, control logic 2300, an input/output interface 2400, and an impedance calibration circuit 2500.

The memory cell array 2100 may include memory cells arranged at intersections of rows (e.g., word lines) and columns (e.g., bit lines). Each memory cell may store 1-bit data or M-bit data as multi-bit data (M being an integer of 2 or more). Under a control of the control logic 2300, the read/write circuit 2200 may write data at the memory cell array 2100 and read data from the memory cell array 2100.

The read/write circuit 2200, although not shown in figures, may include a row selector for selecting rows of the memory cell array 2100, page buffers connected with bit lines of the memory cell array 2100, a column selector for selecting the page buffers, etc.). The input/output interface 2400 may be connected with DQ pads (or, DQ pins) DQ1 to DQi, and may be configured to interface with an external device (e.g., a memory controller 1000 of FIG. 1). Although not shown in figures, the input/output interface 2400 may include an input buffer for receiving data, an output buffer for outputting data, and the like.

The impedance calibration circuit 2500 may be connected with a ZQ pad (or, ZQ pin). The ZQ pad may be connected with a reference resistor RQ which exists outside the nonvolatile memory device 2000. The impedance calibration circuit 2500 may perform an impedance calibration operation in response to a control of the control logic 2300. Here, the control logic 2300 may activate the impedance calibration circuit 2500 when a command sequence accompanying an impedance calibration operation is received. Activation of the impedance calibration circuit 2500 may be performed by a control signal ZQ_EN generated from the control logic 2300. Under a control of the control logic 2300, an impedance calibration operation of the impedance calibration circuit 2500 may be performed during a time when an operation corresponding to a command sequence is performed. In the event that there is received a command sequence not accompanying an impedance calibration operation, the impedance calibration circuit 2500 may not be activated.

The impedance calibration circuit 2500 may include a pull-up code (PUCG) generator 2510 and a pull-down code generator (PDCG) 2520. When the impedance calibration circuit 2500 is activated by the control signal ZQ_EN generated from the control logic 230, the pull-up code generator 2510 and the pull-down code generator 2520 may generate a pull-up code and a pull-down code based on the reference resistor RQ, respectively. The pull-up code may be used to calibrate pull-up impedance of an output driver of the input/output interface 2400, and the pull-down code may be used to calibrate pull-down impedance of the output driver of the input/output interface 2400. The impedance calibration circuit 2500 may be implemented variously. For example, examples of the impedance calibration circuit 2500 are disclosed in U.S. Pat. Nos. 6,573,746, 7,407,379, 7,782,079, 7,929,357, and 7,969,182, the entire contents of which are hereby incorporated by reference.

In example embodiments, the nonvolatile memory device 2000 may operate according to an operating method which includes operations of receiving a command sequence, detecting whether the input command sequence accompanies an impedance calibration operation, and if the input command sequence accompanies the impedance calibration operation, simultaneously performing an operation corresponding to the input command sequence and the impedance calibration operation.

FIGS. 6A and 6B are diagrams a read command sequence according to an embodiment of the inventive concepts.

When a read request is received from a host, a memory controller 1000 may send a command and an address to a nonvolatile memory device 2000 according to a read command sequence. Prior to a transfer of the read command sequence, the memory controller 1000 may determine whether an impedance calibration operation of the nonvolatile memory device 2000 is required. Whether an impedance calibration operation of the nonvolatile memory device 2000 is required, as described with reference to FIGS. 2 and 3, may be determined based on at least one of a temperature, a voltage and a host request frequency or a combination thereof. In the event that the impedance calibration operation of the nonvolatile memory device 2000 is required, the memory controller 1000 may provide the nonvolatile memory device 2000 with a command and address according to a read command sequence accompanying the impedance calibration operation.

As illustrated in FIG. 6A, the memory controller 1000 may transfer a first command 00h, an address, a second command 30h, and a third command ZQCMD sequentially to the nonvolatile memory device 2000. The nonvolatile memory device 2000 may perform a read operation in response to the first and second command 00h and 30h. At this time, a ready/busy signal R/BB may transition to a low level while the read operation is performed. Also, control logic 2300 of the nonvolatile memory device 2000 may activate a control signal ZQ_EN in response to the third command ZQCMD. As the control signal ZQ_EN is activated, an impedance calibration circuit 2500 may perform an impedance calibration operation according to a well-known manner. That is, as illustrated in FIG. 6A, the impedance calibration operation of the nonvolatile memory device 2000 may be performed during a read time tR without an additional time. A time taken to perform the impedance calibration operation may be shorter than the read time tR. A pull-up code and a pull-down code generated according to the impedance calibration operation may be provided to an output driver of an input/output interface 2400. If the read operation is completed, the ready/busy signal R/BB may transition to a high level such that read data is sent to the memory controller 1000.

Referring to FIG. 6B, the memory controller 1000 may transfer a first command 00h, an address, and a second command NCMD sequentially to the nonvolatile memory device 2000. The second command NCMD may be used to indicate information corresponding to the second and third commands 30h and ZQCMD described in FIG. 6A. The nonvolatile memory device 2000 may perform a read operation and an impedance calibration operation in response to the first and second command 00h and NCMD. At this time, the control signal ZQ_EN for controlling the impedance calibration operation may go to a high level during execution of the impedance calibration operation, and the ready/busy signal R/BB may transition to a low level while the read operation is performed. As the control signal ZQ_EN is activated, the impedance calibration circuit 2500 may perform the impedance calibration operation according to a well-known manner. That is, as illustrated in FIG. 6B, the impedance calibration operation of the nonvolatile memory device 2000 may be performed during a read time tR without an additional time. A time taken to perform the impedance calibration operation may be shorter than the read time tR. A pull-up code and a pull-down code generated according to the impedance calibration operation may be provided to the output driver of the input/output interface 2400. If the read operation is completed, the ready/busy signal R/BB may transition to a high level such that read data is sent to the memory controller 1000.

Read command sequences described with reference to FIGS. 6A and 6B may be used when the impedance, calibration operation is required. If the impedance calibration operation is not required, a default read command sequence may be used. For example, the default read command sequence may be formed of a first command 00h, an address, and a second command 30h. When the default read command sequence is received, the impedance calibration operation of the nonvolatile memory device 2000 may not be performed.

FIGS. 7A and 7B are diagrams a program command sequence according to an embodiment of the inventive concepts.

When a program request is received from a host, a memory controller 1000 may send a command, an address, and data to a nonvolatile memory device 2000 according to a program command sequence. Prior to a transfer of the program command sequence, the memory controller 1000 may determine whether an impedance calibration operation of the nonvolatile memory device 2000 is required. Whether an impedance calibration operation of the nonvolatile memory device 2000 is required, as described with reference to FIGS. 2 and 3, may be determined based on at least one of a temperature, a voltage and a host request frequency or a combination thereof. In the event that the impedance calibration operation of the nonvolatile memory device 2000 is required, the memory controller 1000 may provide the nonvolatile memory device 2000 with a command and address according to a program command sequence accompanying the impedance calibration operation.

As illustrated in FIG. 7A, the memory controller 1000 may transfer a first command 80h, an address, data, a second command 10h, and a third command ZQCMD sequentially to the nonvolatile memory device 2000. The nonvolatile memory device 2000 may perform a program operation in response to the first and second command 80h and 10h. At this time, a ready/busy signal R/BB may transition to a low level while the program operation is performed. Also, control logic 2300 of the nonvolatile memory device 2000 may activate a control signal ZQ_EN in response to the third command ZQCMD. As the control signal ZQ_EN is activated, an impedance calibration circuit 2500 may perform an impedance calibration operation according to a well-known manner. That is, as illustrated in FIG. 7A, the impedance calibration operation of the nonvolatile memory device 2000 may be performed during a program time tPGM without an additional time. A time taken to perform the impedance calibration operation may be shorter than the program time tPGM. A pull-up code and a pull-down code generated according to the impedance calibration operation may be provided to an output driver of an input/output interface 2400. If the program operation is completed, the ready/busy signal R/BB may transition to a high level. Afterwards, the nonvolatile memory device 2000 may provide status data SR to the memory controller 1000 in response to a status read command 70h.

Referring to FIG. 7B, the memory controller 1000 may transfer a first command 80h, an address, data, and a second command NCMD sequentially to the nonvolatile memory device 2000. The second command NCMD may be used to indicate information corresponding to the second and third commands 10h and ZQCMD described in FIG. 7A. The nonvolatile memory device 2000 may perform a program operation and an impedance calibration operation in response to the first and second command 80h and NCMD. At this time, the control signal ZQ_EN for controlling the impedance calibration operation may go to a high level during execution of the impedance calibration operation, and the ready/busy signal R/BB may transition to a low level while the program operation is performed. As the control signal ZQ_EN is activated, the impedance calibration circuit 2500 may perform the impedance calibration operation according to a well-known manner. That is, as illustrated in FIG. 7B, the impedance calibration operation of the nonvolatile memory device 2000 may be performed during a program time tPGM without an additional time. A time taken to perform the impedance calibration operation may be shorter than the program time tPGM. A pull-up code and a pull-down code generated according to the impedance calibration operation may be provided to the output driver of the input/output interface 2400. If the program operation is completed, the ready/busy signal R/BB may transition to a high level. Afterwards, the nonvolatile memory device 2000 may provide status data SR to the memory controller 1000 in response to a status read command 70h.

Program command sequences described with reference to FIGS. 7A and 7B may be used when the impedance calibration operation is required. If the impedance calibration operation is not required, a default program command sequence may be used. For example, the default program command sequence may be formed of a first command 80h, an address, data, and a second command 10h. When the default program command sequence is received, the impedance calibration operation of the nonvolatile memory device 2000 may not be performed.

Figure 8A:
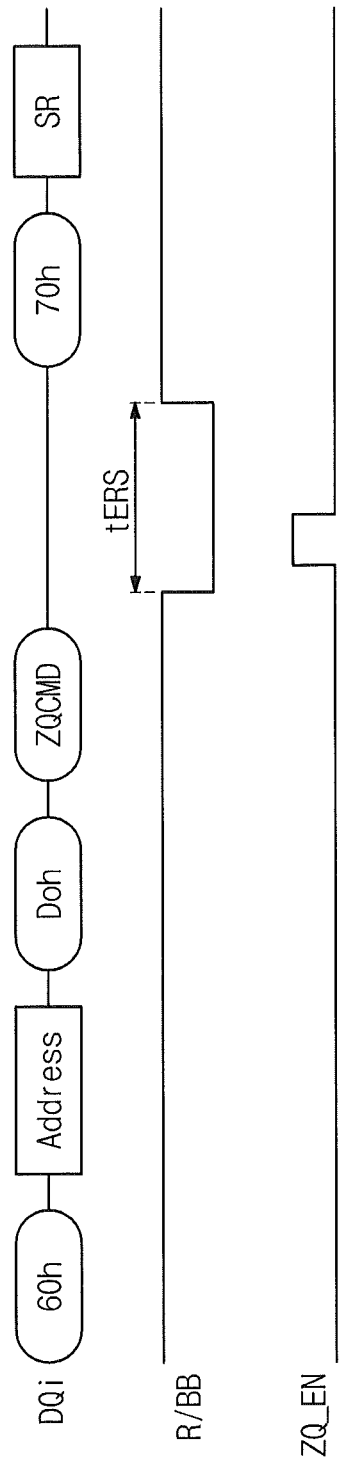
FIGS. 8A and 8B are diagrams an erase command sequence according to an embodiment of the inventive concepts.
Figure 8B:
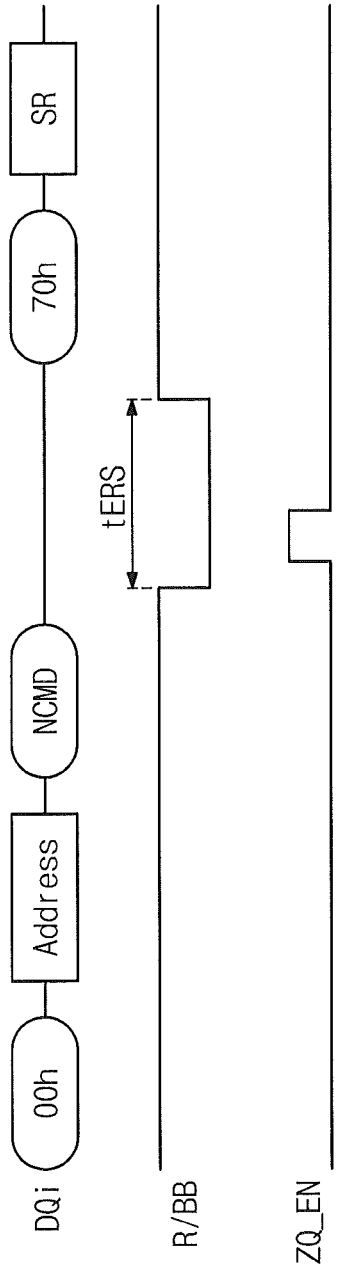

FIGS. 8A and 8B are diagrams an erase command sequence according to an embodiment of the inventive concepts.

At an erase operation, a memory controller 1000 may send a command, an address, and data to a nonvolatile memory device 2000 according to an erase command sequence. Prior to a transfer of the erase command sequence, the memory controller 1000 may determine whether an impedance calibration operation of the nonvolatile memory device 2000 is required. Whether an impedance calibration operation of the nonvolatile memory device 2000 is required, as described with reference to FIGS. 2 and 3, may be determined based on at least one of a temperature, a voltage and a host request frequency or a combination thereof. In the event that the impedance calibration operation of the nonvolatile memory device 2000 is required, the memory controller 1000 may provide the nonvolatile memory device 2000 with a command and address according to an erase command sequence accompanying the impedance calibration operation.

As illustrated in FIG. 8A, the memory controller 1000 may transfer a first command 60h, an address, a second command D0h, and a third command ZQCMD sequentially to the nonvolatile memory device 2000. The nonvolatile memory device 2000 may perform an erase operation in response to the first and second command 60h and D0h. At this time, a ready/busy signal R/BB may transition to a low level while the erase operation is performed. Also, control logic 2300 of the nonvolatile memory device 2000 may activate a control signal ZQ_EN in response to the third command ZQCMD. As the control signal ZQ_EN is activated, an impedance calibration circuit 2500 may perform an impedance calibration operation according to a well-known manner. That is, as illustrated in FIG. 8A, the impedance calibration operation of the nonvolatile memory device 2000 may be performed during an erase time tERS without an additional time. A time taken to perform the impedance calibration operation may be shorter than the erase time tERS. A pull-up code and a pull-down code generated according to the impedance calibration operation may be provided to an output driver of an input/output interface 2400. If the erase operation is completed, the ready/busy signal R/BB may transition to a high level. Afterwards, the nonvolatile memory device 2000 may provide status data SR to the memory controller 1000 in response to a status read command 70h.

At the erase operation, referring to FIG. 8B, the memory controller 1000 may transfer a first command 60h, an address, and a second command NCMD sequentially to the nonvolatile memory device 2000. The second command NCMD may be used to indicate information corresponding to the second and third commands Doh and ZQCMD described in FIG. 8A. The nonvolatile memory device 2000 may perform an erase operation and an impedance calibration operation in response to the first and second command Doh and NCMD. At this time, the control signal ZQ_EN for controlling the impedance calibration operation may go to a high level during execution of the impedance calibration operation, and the ready/busy signal R/BB may transition to a low level while the erase operation is performed. As the control signal ZQ_EN is activated, the impedance calibration circuit 2500 may perform the impedance calibration operation according to a well-known manner. That is, as illustrated in FIG. 8B, the impedance calibration operation of the nonvolatile memory device 2000 may be performed during an erase time tERS without an additional time. A time taken to perform the impedance calibration operation may be shorter than the erase time tERS. A pull-up code and a pull-down code generated according to the impedance calibration operation may be provided to the output driver of the input/output interface 2400. If the erase operation is completed, the ready/busy signal R/BB may transition to a high level. Afterwards, the nonvolatile memory device 2000 may provide status data SR to the memory controller 1000 in response to a status read command 70h.

Erase command sequences described with reference to FIGS. 8A and 8B may be used when the impedance calibration operation is required. If the impedance calibration operation is not required, a default erase command sequence may be used. For example, the default erase command sequence may be formed of a first command 60h, an address, and a second command Doh. When the default erase command sequence is received, the impedance calibration operation of the nonvolatile memory device 2000 may not be performed.

FIGS. 9A and 9B are diagrams a set feature command sequence according to an embodiment of the inventive concepts.

At a set feature operation, a memory controller 1000 may send a command and data to a nonvolatile memory device 2000 according to a set feature command sequence. Prior to a transfer of the set feature command sequence, the memory controller 1000 may determine whether an impedance calibration operation of the nonvolatile memory device 2000 is required. In the event that the impedance calibration operation of the nonvolatile memory device 2000 is required, the memory controller 1000 may provide the nonvolatile memory device 2000 with a command and data according to a set feature command sequence accompanying the impedance calibration operation.

As illustrated in FIG. 9A, the memory controller 1000 may transfer a first command EFh, a second command XXh, data, and a third command ZQCMD sequentially to the nonvolatile memory device 2000. The nonvolatile memory device 2000 may perform a set feature operation in response to the first and second command EFh and XXh. At this time, a ready/busy signal R/BB may transition to a low level while the set feature operation is performed. Also, control logic 2300 of the nonvolatile memory device 2000 may activate a control signal ZQ_EN in response to the third command ZQCMD. As the control signal ZQ_EN is activated, an impedance calibration circuit 2500 may perform an impedance calibration operation according to a well-known manner. That is, as illustrated in FIG. 9A, the impedance calibration operation of the nonvolatile memory device 2000 may be performed during a set feature time tFEAT without an additional time. A time taken to perform the impedance calibration operation may be shorter than the set feature time tFEAT. A pull-up code and a pull-down code generated according to the impedance calibration operation may be provided to an output driver of an input/output interface 2400. If the set feature operation is completed, the ready/busy signal R/BB may transition to a high level.

At the set feature operation, referring to FIG. 9B, the memory controller 1000 may transfer a first command EFh, a second command NCMD, and data sequentially to the nonvolatile memory device 2000. The second command NCMD may be used to indicate information corresponding to the second and third commands XXh and ZQCMD described in FIG. 9A. The nonvolatile memory device 2000 may perform a set feature operation and an impedance calibration operation in response to the first and second command EFh and NCMD. At this time, the control signal ZQ_EN for controlling the impedance calibration operation may go to a high level during execution of the impedance calibration operation, and the ready/busy signal R/BB may transition to a low level while the set feature operation is performed. As the control signal ZQ_EN is activated, the impedance calibration circuit 2500 may perform the impedance calibration operation according to a well-known manner. That is, as illustrated in FIG. 9B, the impedance calibration operation of the nonvolatile memory device 2000 may be performed during a set feature time tFEAT without an additional time. A time taken to perform the impedance calibration operation may be shorter than the set feature time tFEAT. A pull-up code and a pull-down code generated according to the impedance calibration operation may be provided to the output driver of the input/output interface 2400. If the set feature operation is completed, the ready/busy signal R/BB may transition to a high level.

Set feature command sequences described with reference to FIGS. 98A and 9B may be used when the impedance calibration operation is required. If the impedance calibration operation is not required, a default set feature command sequence may be used. For example, the default set feature command sequence may be formed of a first command EFh, a second command XXh, and data. When the default set feature command sequence is received, the impedance calibration operation of the nonvolatile memory device 2000 may not be performed.

Although not shown in figures, operations needing a period where the nonvolatile memory device 2000 is maintained at a busy state may be used to perform an impedance calibration operation of the nonvolatile memory device 2000. In this case, a busy time of an operation needing a period where the nonvolatile memory device 2000 is maintained at a busy state may be longer than a time taken to perform the impedance calibration operation.

Figure 10:
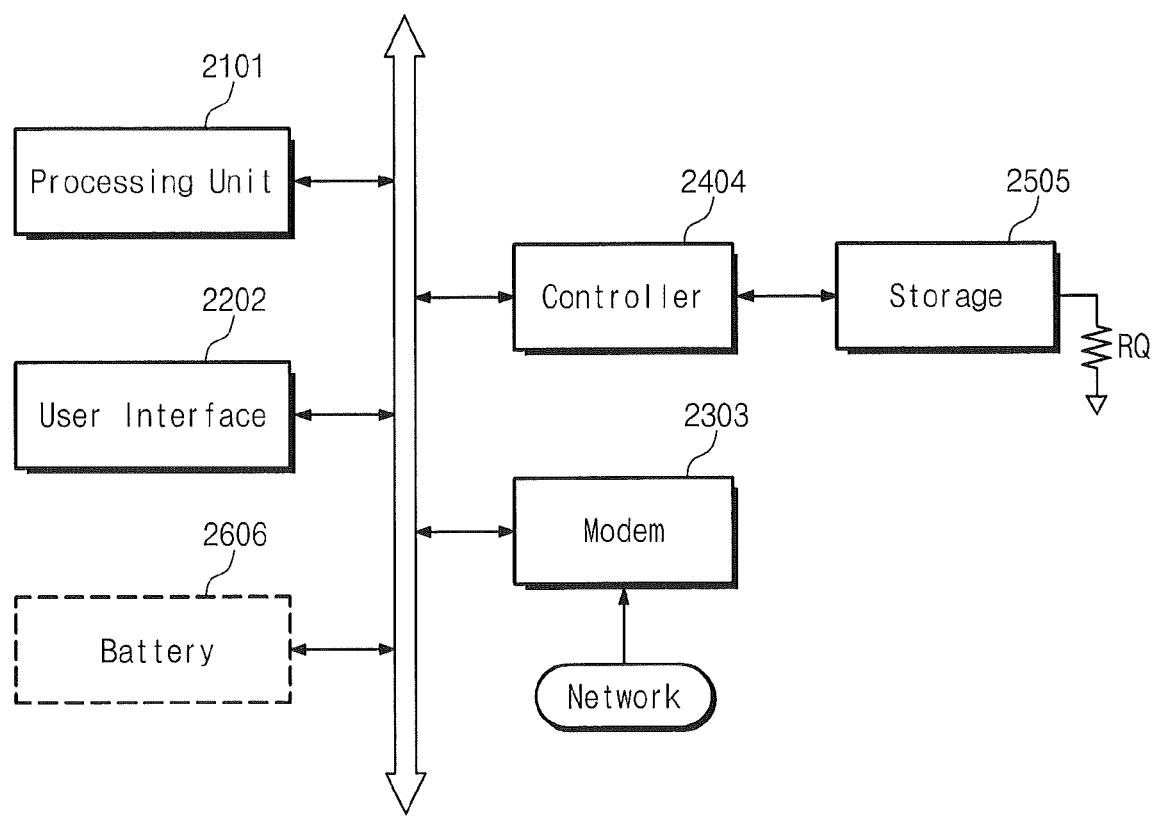
FIG. 10 is a block diagram schematically illustrating a computing system according to an embodiment of the inventive concepts.

FIG. 10 is a block diagram schematically illustrating a computing system according to an embodiment of the inventive concepts. A computing system may include a processing unit 2101, a user interface 2202, a modem 2303 such as a baseband chipset, a memory controller 2404, and storage medium 2505.

The memory controller 2404 may be configured substantially the same as that described in FIG. 2 or 3, and the storage medium 2505 may be formed of a nonvolatile memory device of FIG. 5 connected with a reference resistor RQ. For example, at an erase operation or a set feature operation, the memory controller 2404 may select one of first and second command sequences according to whether an impedance calibration operation of the nonvolatile memory device is required. Here, the first command sequence may be a command sequence accompanying the impedance calibration operation, and the second command sequence may be a default command sequence not accompanying the impedance calibration operation. When a command sequence accompanying the impedance calibration operation is provided to the nonvolatile memory device, the impedance calibration operation may be performed while an operation corresponding to the command sequence is performed (or, during a busy period).

N-bit data (N being 1 or more integer) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 10, the computing system may further comprise an application chipset, a camera image processor (CIS), a mobile DRAM, and the like.

Figure 11:
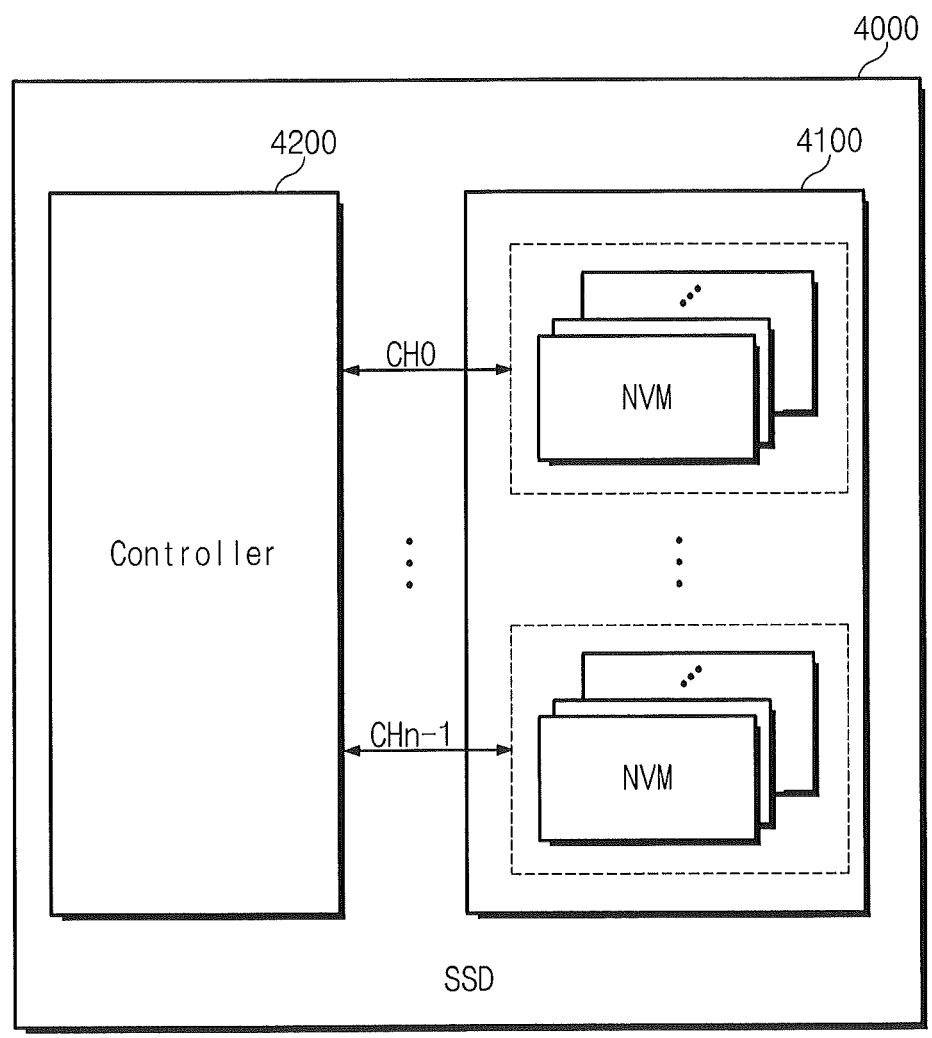
FIG. 11 is a block diagram schematically illustrating a solid state drive according to an embodiment of the inventive concepts.

FIG. 11 is a block diagram schematically illustrating a solid state drive according to an embodiment of the inventive concepts.

Referring to FIG. 11, a solid state drive (SSD) 4000 may comprise storage medium 4100 and a controller 4200. The storage medium 4100 may be connected with the controller 4200 via a plurality of channels CH0-CHn-1, each of which is commonly connected with a plurality of nonvolatile memories. The controller 4200 may be configured substantially the same as that described in FIG. 2 or 3, and each of nonvolatile memory (NVM) devices of the storage medium 4100 may be formed of a nonvolatile memory device of FIG. 5. Each of nonvolatile memory devices of the storage medium 4100 may be configured to perform an impedance calibration operation. A reference resistor for the impedance calibration operation, although not shown in figures, may be shared by a channel unit or a way unit, or connected with each nonvolatile memory device.

For example, at a host request, an erase operation or a set feature operation, the controller 4200 may select one of first and second command sequences according to whether an impedance calibration operation of the nonvolatile memory device is required. Here, the first command sequence may be a command sequence accompanying the impedance calibration operation, and the second command sequence may be a default command sequence not accompanying the impedance calibration operation. When a command sequence accompanying the impedance calibration operation is provided to the nonvolatile memory device, the impedance calibration operation may be performed while an operation corresponding to the command sequence is performed (or, during a busy period).

Figure 12:
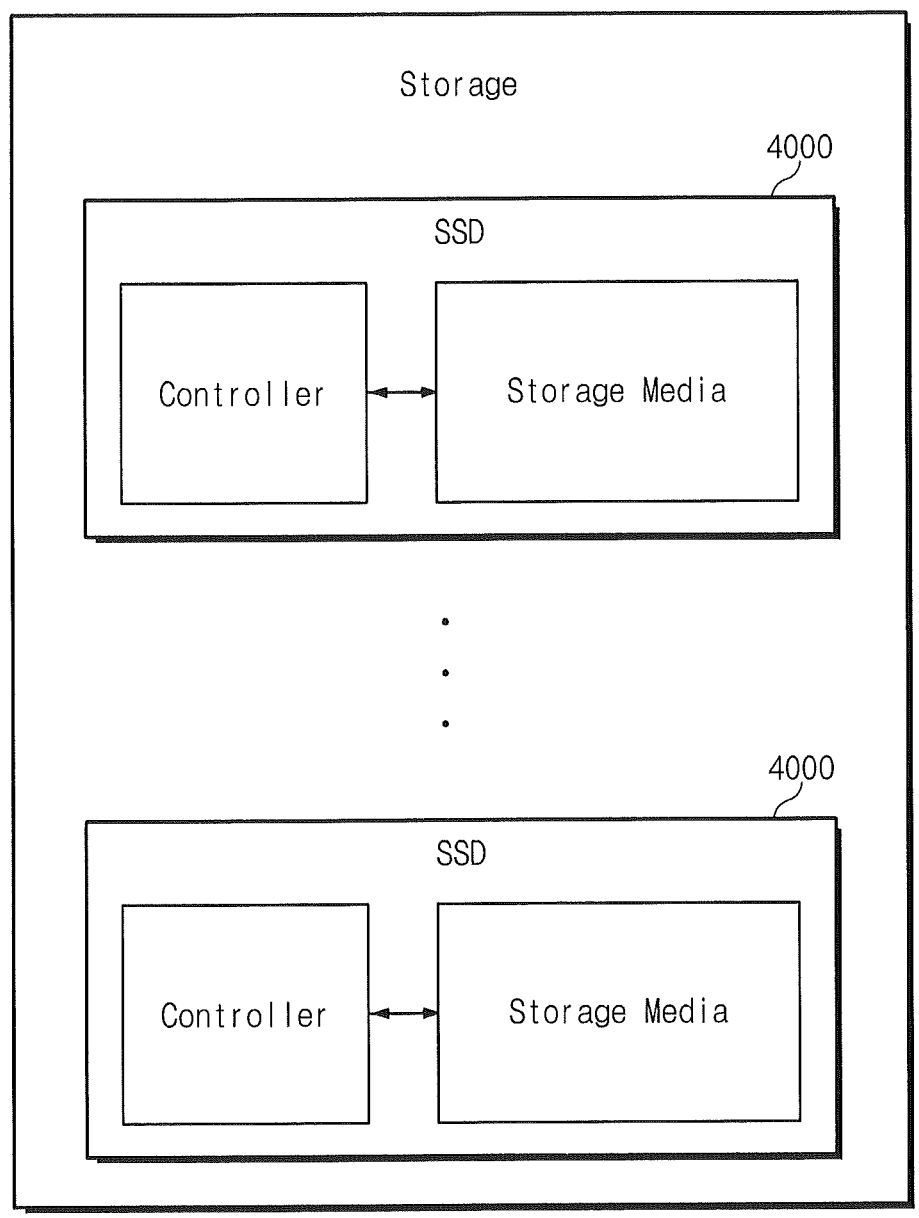
FIG. 12 is a block diagram schematically illustrating a storage using a solid state drive in FIG. 11.
Figure 13:
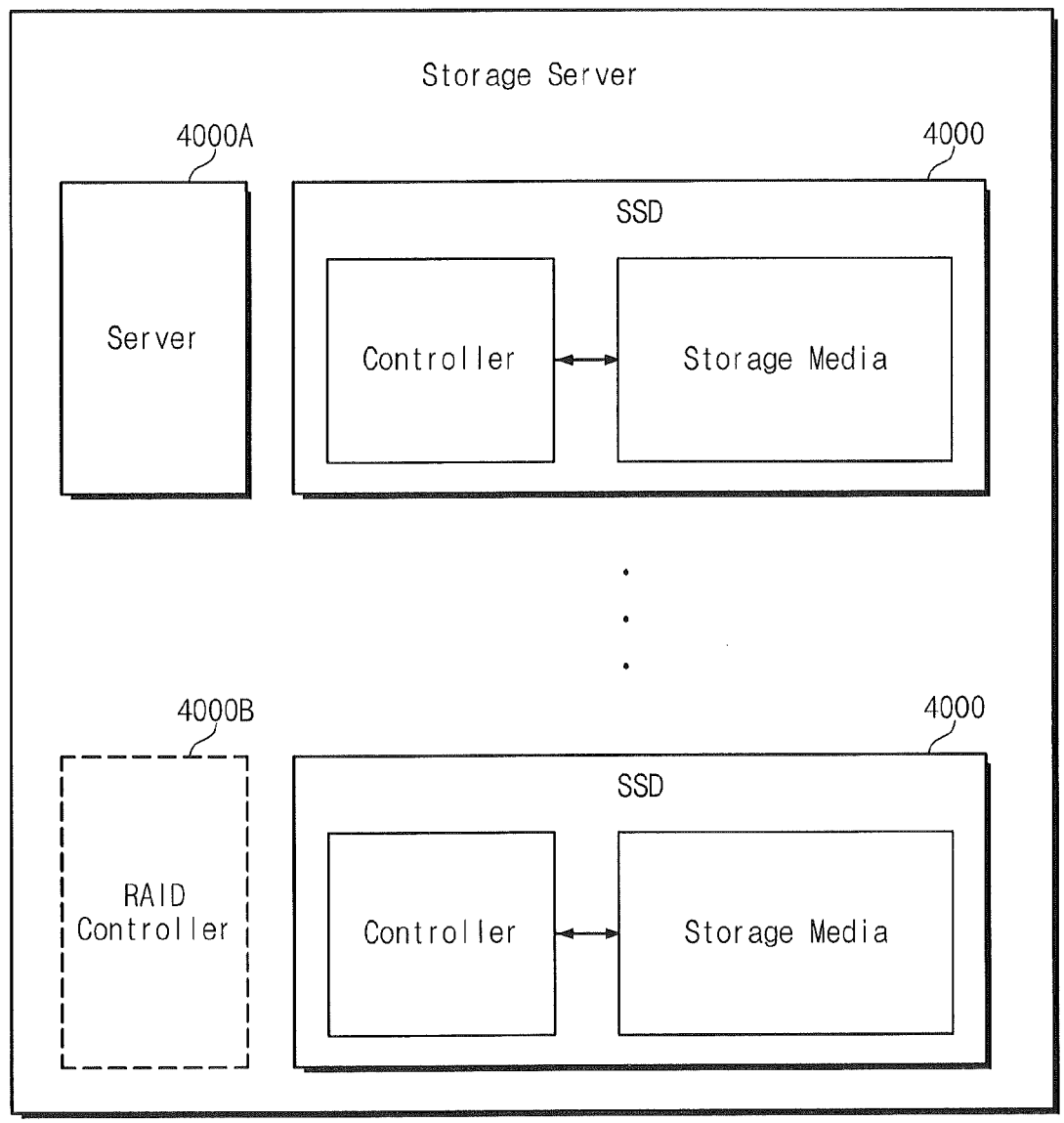
FIG. 13 is a block diagram schematically illustrating a storage server using a solid state drive in FIG. 11.

FIG. 12 is a block diagram schematically illustrating a storage using a solid state drive in FIG. 11, and FIG. 13 is a block diagram schematically illustrating a storage server using a solid state drive in FIG. 11.

An SSD 4000 according to an embodiment of the inventive concepts may be used to form the storage. As illustrated in FIG. 12, the storage may include a plurality of solid state drives 4000 which are configured to include a controller and storage media, the same as described in FIG. 11. An SSD 4000 according to an embodiment of the inventive concepts may be used to configure a storage sever. As illustrated in FIG. 13, a storage server includes a plurality of solid state drives 4000, which are configured to include a controller and storage media, the same as described in FIG. 11, and a server 4000A. Further, it is well comprehended that a well-known RAID controller 4000B is provided in the storage server.

Figure 14:
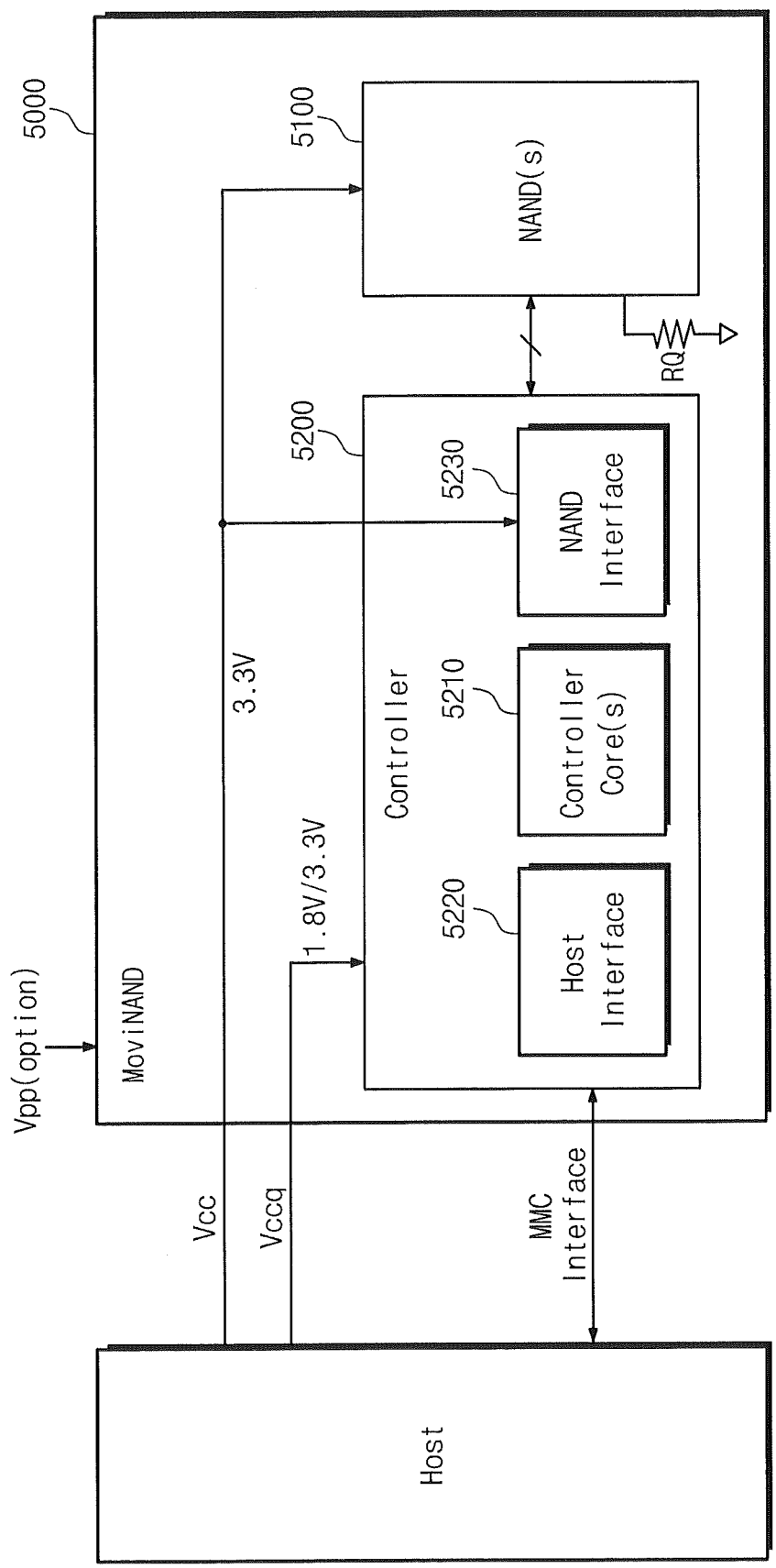
FIG. 14 is a block diagram schematically illustrating a moviNAND according to an embodiment of the inventive concepts.

FIG. 14 is a block diagram schematically illustrating a moviNAND according to an embodiment of the inventive concepts. Referring to FIG. 14, a moviNAND device 5000 may include at least one NAND flash memory device 5100 connected with a reference resistor RQ and a controller 5200. The moviNAND device 5000 may support the MMC 4.4 (or, referred to as "eMMC") standard.

The NAND flash memory device 5100 may be a single data rate (SDR) NAND flash memory device or a double data rate (DDR) NAND flash memory device. In example embodiments, the NAND flash memory device 5100 may include NAND flash memory chips. Herein, the NAND flash memory device 5100 may be implemented by stacking the NAND flash memory chips at one package (e.g., FBGA, Fine-pitch Ball Grid Array, etc.).

Each of the NAND flash memory chips may be formed of a nonvolatile memory device of FIG. 5, and the controller 5200 may be configured substantially the same as that described in FIG. 2 or 3. For example, at a host request, an erase operation or a set feature operation, the memory controller 5200 may select one of first and second command sequences according to whether an impedance calibration operation of the nonvolatile memory device is required. Here, the first command sequence may be a command sequence accompanying the impedance calibration operation, and the second command sequence may be a default command sequence not accompanying the impedance calibration operation. When a command sequence accompanying the impedance calibration operation is provided to the nonvolatile memory device, the impedance calibration operation may be performed while an operation corresponding to the command sequence is performed (or, during a busy period).

The controller 5200 may be connected with the NAND flash memory device 5100 via a plurality of channels. The controller 5200 may include at least one controller core 5210, a host interface 5220, and a NAND interface 5230. The controller core 5210 may control an overall operation of the moviNAND device 5000. The host interface 5220 may be configured to perform an MMC interface between the controller 5200 and a host. The NAND interface 5230 may be configured to interface between the NAND flash memory device 5100 and the controller 5200. In example embodiments, the host interface 5220 may be a parallel interface (e.g., an MMC interface). In other example embodiments, the host interface 5220 of the moviNAND device 5000 may be a serial interface (e.g., UHS-II, UFS, etc.).

The moviNAND device 5000 may receive power supply voltages Vcc and Vccq from the host. Herein, the power supply voltage Vcc (about 3.3V) may be supplied to the NAND flash memory device 5100 and the NAND interface 5230, while the power supply voltage Vccq (about 1.8V/3.3V) may be supplied to the controller 5200. In example embodiments, an external high voltage Vpp may be optionally supplied to the moviNAND device 5000.

The moviNAND device 5000 according to an embodiment of the inventive concepts may be advantageous to store mass data as well as may have an improved read characteristic. The moviNAND device 5000 according to an embodiment of the inventive concepts is applicable to small and low-power mobile products (e.g., a Galaxy S, iPhone, etc.).

Figure 15:
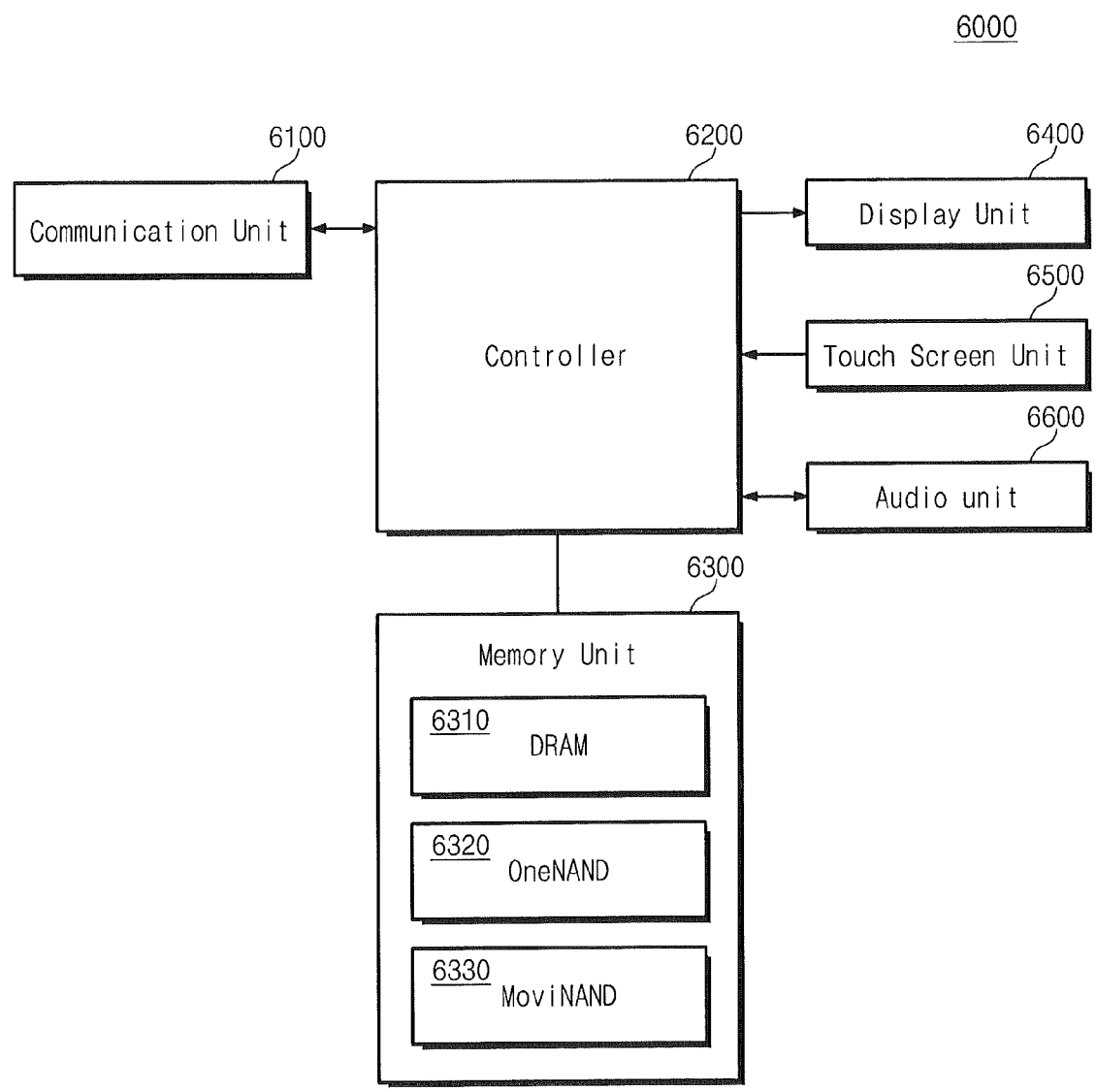
FIG. 15 is a block diagram schematically illustrating a communication device according to an embodiment of the inventive concepts.

FIG. 15 is a block diagram schematically illustrating a communication device according to an embodiment of the inventive concepts. Referring to FIG. 15, a communication device 6000 may include a communication unit 6100, a controller 6200, a memory unit 6300, a display unit 6400, a touch screen unit 6500, and an audio unit 6600. The memory unit 6300 may include at least one DRAM 6310, at least one OneNAND 6320, and at least one moviNAND 6330.

A detailed description of the mobile device is disclosed in U.S. Patent Publication Nos. 2010/0010040, 2010/0062715, 2010/00199081, 2010/0309237 and 2010/0315325, the entire contents of which are herein incorporated by references.

Figure 16:
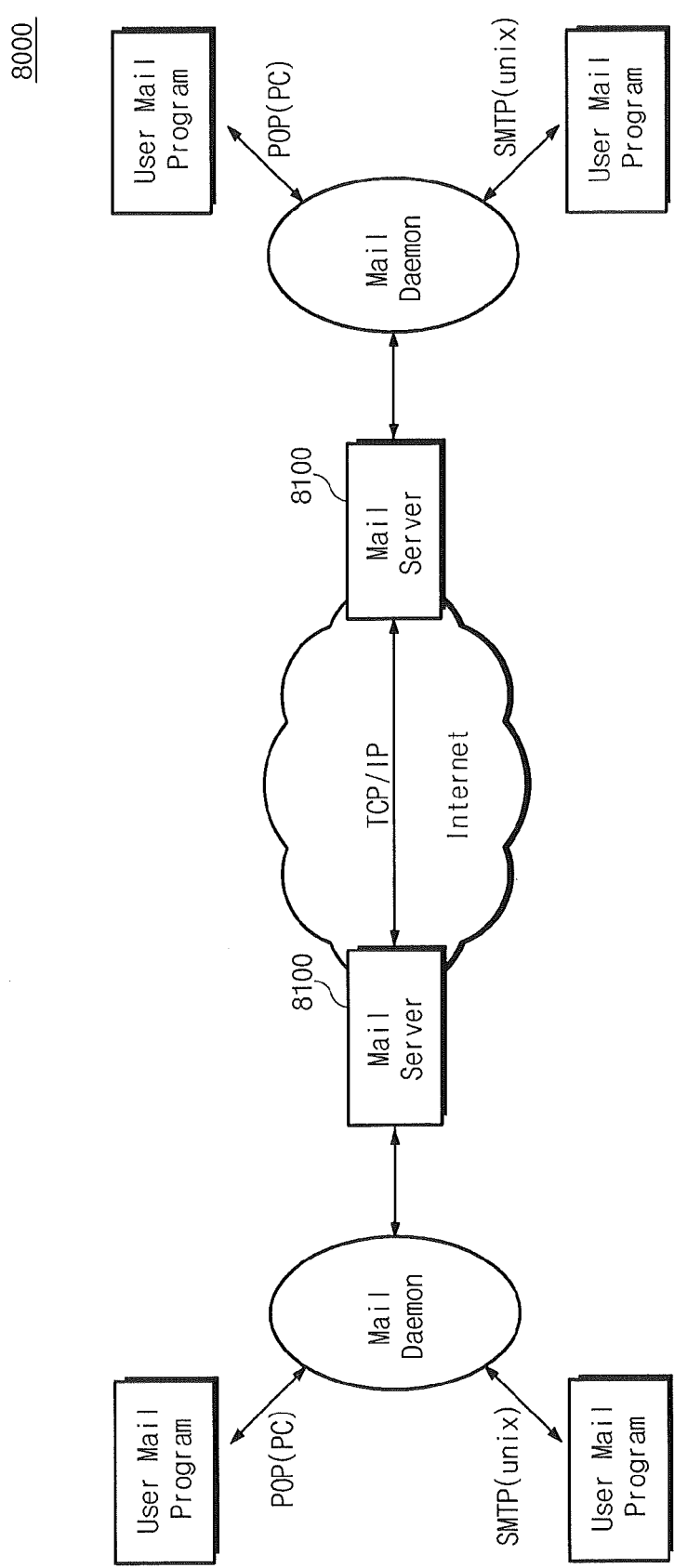
FIG. 16 is a diagram schematically illustrating systems to which a data storage device according to embodiments of the inventive concepts is applied.

FIG. 16 is a diagram schematically illustrating systems to which a data storage device according to embodiments of the inventive concepts is applied.

As illustrated in FIG. 16, a solid state drive including a data storage device according to an embodiment of the inventive concepts may be applied to a main mail server 8100. The server 8100 may communicate bidirectionally with a mail daemon, which itself may communicate bidirectionally with a user mail program using POP for a PC and SMTP for Unix.

Figure 17:
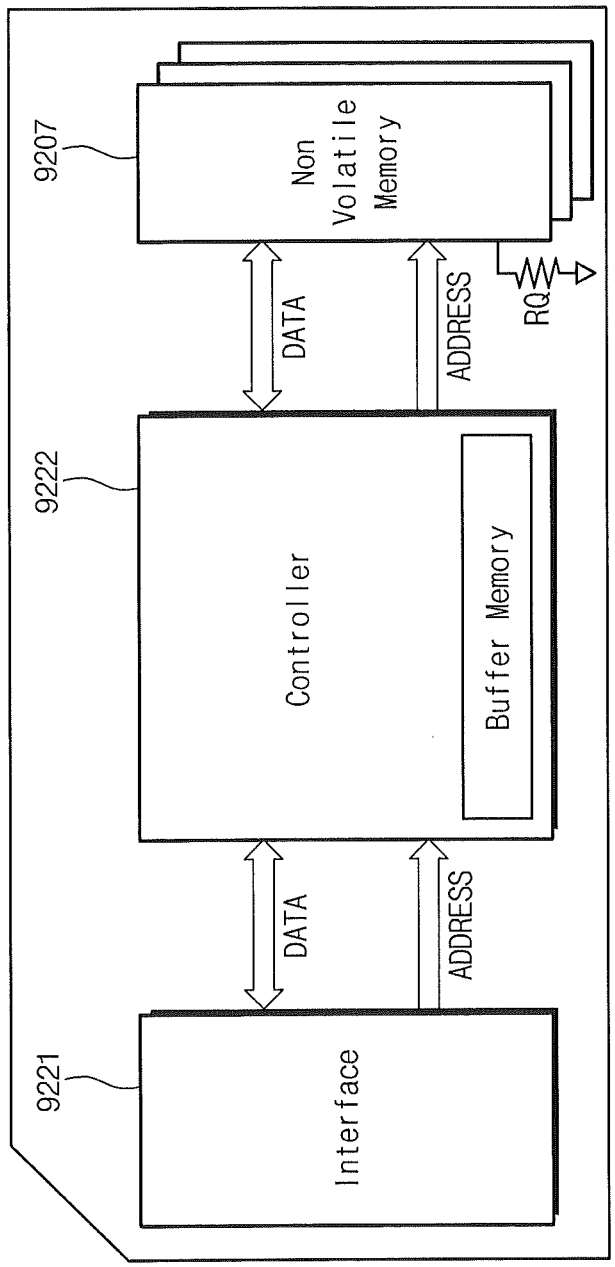
FIG. 17 is a block diagram schematically illustrating a memory card according to an embodiment of the inventive concepts.

FIG. 17 is a block diagram schematically illustrating a memory card according to an embodiment of the inventive concepts.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 17, the memory card may include an interface circuit 9221 for interfacing with an external device, a controller 9222 including a buffer memory and controlling an operation of the memory card, and one or more nonvolatile memory devices 9207. Each of the one or more nonvolatile memory devices 9207 may be configured to be connected with a reference resistor RQ or to share the reference resistor RQ.

The controller 9222 may be a processor which is configured to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (e.g., SD/MMC) for data exchange between a host and a memory card.

The controller 9222 may be configured substantially the same as that described in FIG. 2 or 3, and the nonvolatile memory device 9207 may be formed of a nonvolatile memory device of FIG. 5 connected with a reference resistor RQ. For example, at a host request, an erase operation or a set feature operation, the controller 9222 may select one of first and second command sequences according to whether an impedance calibration operation of the nonvolatile memory device is required. Here, the first command sequence may be a command sequence accompanying the impedance calibration operation, and the second command sequence may be a default command sequence not accompanying the impedance calibration operation. When a command sequence accompanying the impedance calibration operation is provided to the nonvolatile memory device, the impedance calibration operation may be performed while an operation corresponding to the command sequence is performed (or, during a busy period).

Figure 18:
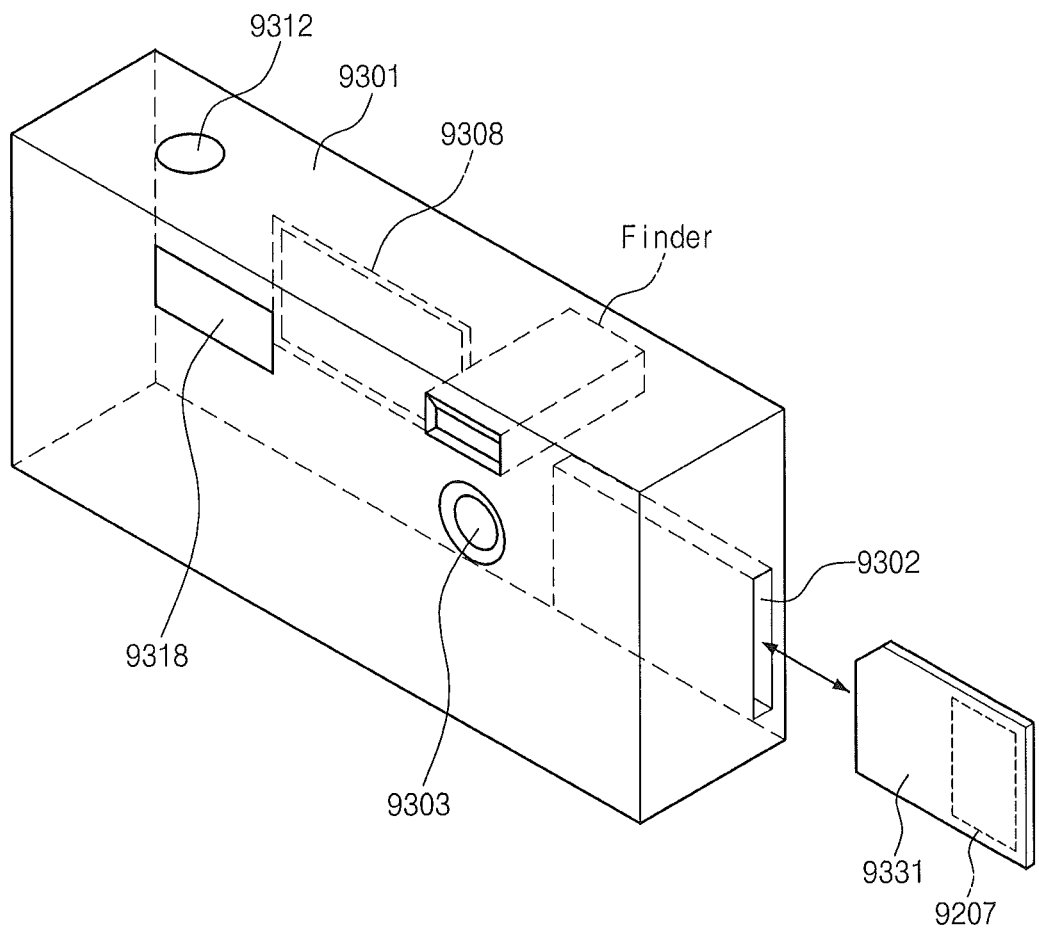
FIG. 18 is a block diagram schematically illustrating a digital still camera according to an embodiment of the inventive concepts.

FIG. 18 is a block diagram schematically illustrating a digital still camera according to an embodiment of the inventive concepts.

Referring to FIG. 18, a digital still camera may include a body 9301, a slot 9302, a lens 9303, a display circuit 9308, a shutter button 9312, a strobe 9318, a viewfinder (finder), and the like. The memory card 9331 may be inserted in the slot 9308, and may include a memory controller described in FIG. 2 or 3 and a nonvolatile memory device described in FIG. 5. For example, at a host request, an erase operation or a set feature operation, the memory controller may select one of first and second command sequences according to whether an impedance calibration operation of the nonvolatile memory device is required. Here, the first command sequence may be a command sequence accompanying the impedance calibration operation, and the second command sequence may be a default command sequence not accompanying the impedance calibration operation. When a command sequence accompanying the impedance calibration operation is provided to the nonvolatile memory device, the impedance calibration operation may be performed while an operation corresponding to the command sequence is performed (or, during a busy period).

If the memory card 9331 has a contact type, an electric circuit on a circuit board may be electrically contacted with the memory card 9331 when it is inserted in the slot 9302. In the event that the memory card 9331 has a non-contact type, an electric circuit on a circuit board may communicate with the memory card 9331 in a radio-frequency manner.

Figure 19:
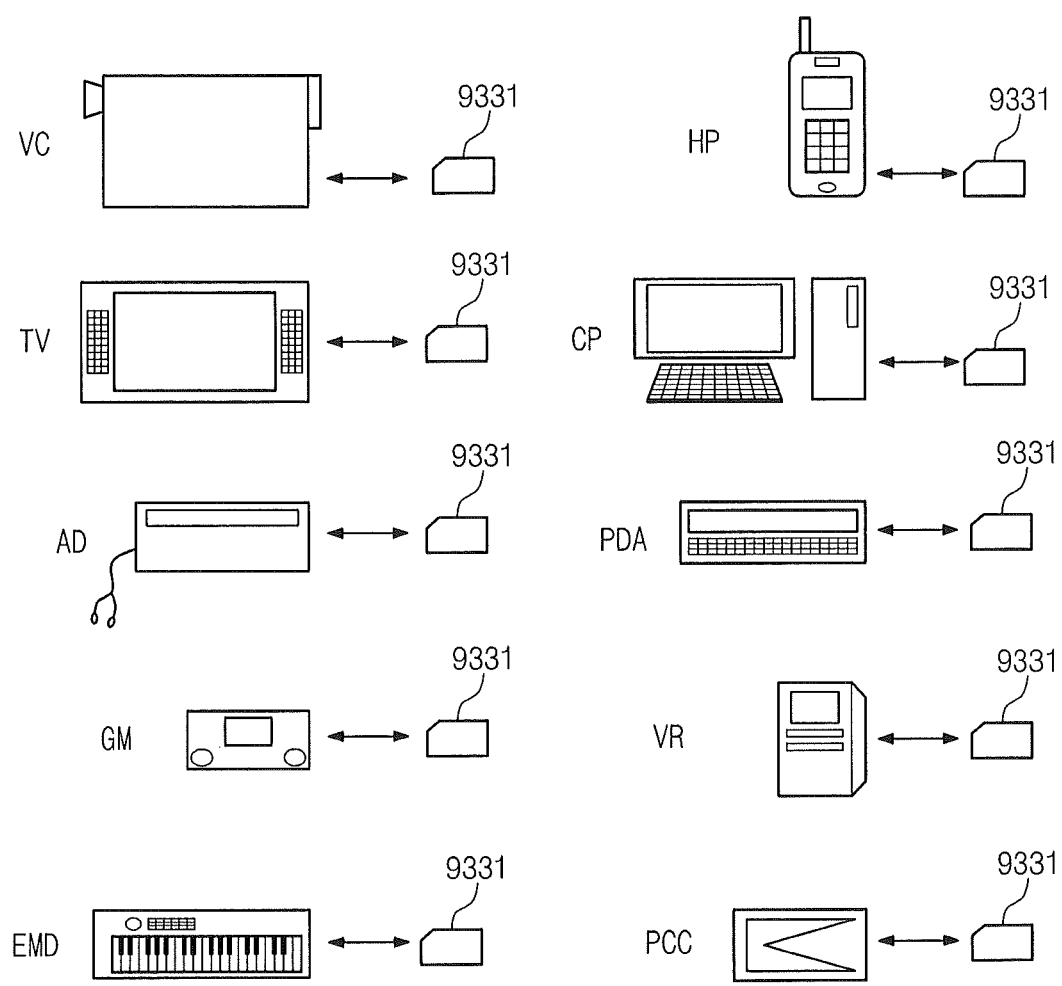
FIG. 19 is a diagram schematically illustrating various systems to which a memory card in FIG. 18 is applied.

FIG. 19 is a diagram schematically illustrating various systems to which a memory card in FIG. 18 is applied.

Referring to FIG. 19, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In example embodiment, memory cells can be formed of a variable resistance memory cell. An exemplary variable resistance memory cell and a memory device including the same are disclosed in U.S. Pat. No. 7,529,124, the entirety of which is incorporated by reference herein.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In still other example embodiments, a memory device having a charge trap flash structure as a charge storage layer is disclosed in U.S. Pat. No. 6,858,906 and U.S. Patent Publication Nos. 2004/0169238 and 2006/0180851, the entirety of which is incorporated by reference herein. A source-drain free flash structure is disclosed in KR Patent No. 673020, the entirety of which is incorporated by reference herein.

A flash memory device and/or a memory controller according to the inventive concepts may be packed using various types of packages. For example, A non-volatile memory device or a memory controller according to the inventive concepts may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory device, comprising:
a memory cell array;
a control logic configured to detect whether an input command sequence for performing a read operation of the memory cell array, a program operation of the memory cell array, or an erase operation of the memory cell array accompanies an impedance calibration operation;
an impedance calibration circuit connected with an external reference resistor and configured to generate an impedance calibration code in response to the control logic detecting that the input command sequence for performing a read operation of the memory cell array, a program operation of the memory cell array, or an erase operation of the memory cell array accompanies the impedance calibration operation; and
an output driver having an output impedance value calibrated by the impedance calibration code.

2. The memory device of claim 1, wherein the control logic activates a control signal when the input command sequence for performing a read operation of the memory cell array, a program operation of the memory cell array, or an erase operation of the memory cell array accompanies the impedance calibration operation and the impedance calibration circuit generates the impedance calibration code in response to an activation of the control signal.

3. The memory device of claim 2, wherein the control logic deactivates the control signal when the input command sequence for performing a read operation of the memory cell array, a program operation of the memory cell array, or an erase operation of the memory cell array does not accompany the impedance calibration operation and the impedance calibration circuit is deactivated by an inactivation of the control signal.

4. The memory device of claim 3, wherein when the input command sequence for performing a read operation of the memory cell array, a program operation of the memory cell array, or an erase operation of the memory cell array does not accompany the impedance calibration operation, the control logic controls an operation corresponding to the input command sequence without the impedance calibration operation.

5. The memory device of claim 1, wherein a time taken to perform the impedance calibration operation is shorter than a time taken to perform the read operation of the memory cell array, the program operation of the memory cell array, or the erase operation of the memory cell array.

6. The memory device of claim 1, wherein the memory cell array comprises a plurality of NAND strings.

7. A memory system, comprising:
a reference resistor;
a NAND flash memory device connected with the reference resistor and configured to provide an impedance calibration operation; and
a memory controller configured to provide the NAND flash memory device with one of first and second command sequences according to whether an impedance calibration condition of the NAND flash memory device satisfies a reference,
wherein the first command sequence is a command sequence accompanying the impedance calibration operation and the second command sequence is a default command sequence not accompanying the impedance calibration operation, and
wherein the NAND flash memory device performs the impedance calibration operation during a busy period where an operation corresponding to the first command sequence is performed.

8. The memory system of claim 7, wherein the impedance calibration condition is a temperature, a voltage, or a host request frequency or a combination thereof.

9. The memory system of claim 7, wherein the operation corresponding to the first command sequence is a read operation, a program operation, a set feature operation, or an erase operation.

10. The memory system of claim 7, wherein the first command sequence is implemented by adding a command indicating the impedance calibration operation to the second command sequence or by changing one of commands in the second command sequence into a command indicating the impedance calibration operation.

11. An operating method of a memory device that includes a memory-cell array, the operating method comprising:
receiving an input command sequence for performing a read operation of the memory cell array, a program operation of the memory cell array, or an erase operation of the memory cell array;
detecting whether the input command sequence accompanies an impedance calibration operation of the memory device; and
if the input command sequence accompanies the impedance calibration operation, simultaneously performing the read operation of the memory cell array, the program operation of the memory cell array, or the erase operation of the memory cell array corresponding to the input command sequence, and the impedance calibration operation.

12. The operating method of claim 11, further comprising:
performing the read operation of the memory cell array, the program operation of the memory cell array, or the erase operation of the memory cell array corresponding to the input command sequence without the impedance calibration operation when the input command sequence does not accompany the impedance calibration operation.

13. The operating method of claim 11, wherein a time taken to perform the impedance calibration operation is shorter than a time taken to perform the read operation of the memory cell array, the program operation of the memory cell array, or the erase operation of the memory cell array corresponding to the input command sequence.

* * * * *